United States Patent
Yu

(10) Patent No.: US 11,644,929 B2
(45) Date of Patent: May 9, 2023

(54) CAPACITANCE DETECTING CIRCUIT, TOUCH CONTROL CHIP, TOUCH DETECTION APPARATUS AND ELECTRONIC DEVICE

(71) Applicant: Shenzhen Goodix Technology Co., Ltd., Guangdong (CN)

(72) Inventor: Qian Yu, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 95 days.

(21) Appl. No.: 17/487,332

(22) Filed: Sep. 28, 2021

(65) Prior Publication Data

US 2022/0011891 A1    Jan. 13, 2022

Related U.S. Application Data

(63) Continuation of application No. PCT/CN2020/081771, filed on Mar. 27, 2020.

(51) Int. Cl.
*G06F 3/044*    (2006.01)
*G06F 3/041*    (2006.01)

(52) U.S. Cl.
CPC .......... *G06F 3/044* (2013.01); *G06F 3/04164* (2019.05); *G06F 3/041662* (2019.05)

(58) Field of Classification Search
CPC . G06F 3/044; G06F 3/041662; G06F 3/04164

(Continued)

(56) References Cited

U.S. PATENT DOCUMENTS

| 11,435,864 B1 * | 9/2022 | Van Ostrand ....... G06F 3/04166 |
| 2014/0125625 A1 | 5/2014 | Su et al. |

(Continued)

FOREIGN PATENT DOCUMENTS

| CN | 101937662 A | 1/2011 |
| CN | 102749525 A | 10/2012 |

(Continued)

OTHER PUBLICATIONS

The First Office Action dated Sep. 15, 2022, in corresponding Chinese Application No. 202080001613.0, 14 pages.

(Continued)

*Primary Examiner* — Calvin C Ma
(74) *Attorney, Agent, or Firm* — Maier & Maier, PLLC

(57) ABSTRACT

Provided are a capacitance detecting circuit, a touch control chip, a touch detection apparatus and an electronic device. The capacitance detecting circuit, by configuring a first input side of an operational amplifier as a preset voltage, and utilizing the same characteristics of voltages at two input sides of the operational amplifier, enables that an output voltage in a touch sensor is configured as a preset voltage by a second input side of the operational amplifier, and by changing a position of a drive of a coding voltage, mutual-capacitance and self-capacitance detection can be realized with the same circuit. After replicating a single-channel current signal output by the operational amplifier into a multi-channel current signal, a current subtracting circuit is used to determine a differential signal of current signals output by two adjacent channels, and the differential signal is converted into a voltage through a charge amplifying circuit.

20 Claims, 8 Drawing Sheets

(58) Field of Classification Search
USPC ................................................ 345/173, 174
See application file for complete search history.

(56) References Cited

U.S. PATENT DOCUMENTS

| | | |
|---|---|---|
| 2015/0009179 A1 | 1/2015 | Kim |
| 2015/0029130 A1 | 1/2015 | Collins |
| 2015/0309655 A1 | 10/2015 | Park et al. |
| 2016/0241139 A1 | 8/2016 | Yao et al. |
| 2018/0173365 A1 | 6/2018 | Dinu et al. |
| 2018/0275823 A1 | 9/2018 | Lim |
| 2021/0287609 A1* | 9/2021 | An ..................... G09G 3/3291 |
| 2021/0389354 A1* | 12/2021 | Huynh ................ G01R 19/257 |

FOREIGN PATENT DOCUMENTS

| | | |
|---|---|---|
| CN | 102750057 A | 10/2012 |
| CN | 104484070 A | 4/2015 |
| CN | 106155435 A | 11/2016 |
| CN | 107430464 A | 12/2017 |
| CN | 107690584 A | 2/2018 |
| CN | 108475155 A | 8/2018 |
| CN | 108664162 A | 10/2018 |
| CN | 109375803 A | 2/2019 |
| CN | 110286787 A | 9/2019 |
| KR | 1020150025732 A | 3/2015 |
| KR | 1020180089122 A | 8/2018 |
| TW | 201312419 A | 3/2013 |

OTHER PUBLICATIONS

Zhang et al., "A self-cap and mutual-cap detection circuit for capacitive touch panel", Journal of Beijing Jiaotong University, vol. 40, No. 2, Apr. 2016, pp. 36-40.

International Search Report dated Dec. 20, 2020, in connection with corresponding PCT Application No. PCT/CN2020/081771; 4 pp. with English translation.

\* cited by examiner

CAPACITANCE DETECTING CIRCUIT, TOUCH CONTROL CHIP, TOUCH DETECTION APPARATUS AND ELECTRONIC DEVICE

CROSS-REFERENCE TO RELATED APPLICATIONS

This application is a continuation of the International Application No. PCT/CN2020/081771, filed on Mar. 27, 2020, the content of which is incorporated herein by reference in its entirety.

TECHNICAL FIELD

The present disclosure relates to the field of electronic technologies, and in particular, to a capacitance detecting circuit, a touch control chip, a touch detection apparatus and an electronic device.

BACKGROUND

With the rapid development of electronic technologies, capacitive sensors have a wide application prospect in touch smart terminals (such as mobile phones, tablets, computers and other smart mobile terminals).

In a capacitive sensor, a capacitance value will change with touch. Through a capacitance detecting circuit, a change of the capacitance value will be read out, so that a smart terminal can judge a user's operation, thereby achieving a better human-computer interaction experience.

SUMMARY

The present disclosure provides a capacitance detecting circuit, a touch control chip, a touch detection apparatus and an electronic device to solve the problem of capacitance detection.

In a first aspect, the present disclosure provides a capacitance detecting circuit which includes: an operational amplifier, a current signal replication circuit, a current subtracting circuit, a charge amplifying circuit, an analog-to-digital conversion circuit and a processing circuit;

a first input side of the operational amplifier is used to input a preset voltage;

a second input side of the operational amplifier is used to configure an output voltage in a touch sensor as the preset voltage;

an output side of the operational amplifier is connected with an input side of the current signal replication circuit;

an output side of the current signal replication circuit is connected with an input side of the current subtracting circuit, and the current subtracting circuit is used to determine a differential signal of current signals output by two adjacent channels; and an output side of the current subtracting circuit is connected with the charge amplifying circuit, where the charge amplifying circuit is used to convert the differential signal into a voltage, amplify the voltage and input an amplified voltage to the analog-to-digital conversion circuit, so as to determine a touch position through the processing circuit after analog-to-digital conversion.

In a possible design, when the preset voltage is a fixed voltage, the second input side of the operational amplifier is used to configure the output voltage as the fixed voltage, so that all current signals flowing through a coupling capacitor flow into the second input side of the operational amplifier, and the coupling capacitor is a capacitor between an induction electrode and a driving electrode; or, when the preset voltage is a self-capacitance coding voltage, the second input side of the operational amplifier is used to configure the output voltage as the self-capacitance coding voltage, so that all current signals flowing through an induction capacitor flow into the second input side of the operational amplifier.

In a possible design, the first input side of the operational amplifier is connected with a second switch;

when the second switch is in a first state, the first input side of the operational amplifier is connected with an input side of the fixed voltage; and when the second switch is in a second state, the first input side of the operational amplifier is connected with an input side of the self-capacitance coding voltage.

In a possible design, the capacitance detecting circuit further includes: a first switch;

where the first switch is used to select a detection coding voltage of a driving channel;

when the first switch is in a first state, the detection coding voltage is a mutual-capacitance coding voltage, and correspondingly, the preset voltage is the fixed voltage; and when the first switch is in a second state, the detection coding voltage is a self-capacitance coding voltage, and correspondingly, the preset voltage is the self-capacitance coding voltage.

In a possible design, when the first switch is in the second state, a first input side of another operational amplifier is connected with an input side of the self-capacitance coding voltage, and a second input side of the another operational amplifier is used to output the self-capacitance coding voltage to the driving channel.

In a possible design, the current signal replication circuit is a current mirror replication circuit or a positive channel metal oxide semiconductor (PMOS) tube replication circuit.

In a possible design, the current mirror replication circuit includes a first current mirror, a second current mirror and a third current mirror;

an input side of the first current mirror is connected with a collector of a first field effect transistor, a gate of the first field effect transistor is connected with the output side of the operational amplifier, a source of the first field effect transistor is connected with one end of a first resistance, and the other end of the first resistance is grounded; and an output side of the first current mirror is respectively connected with an input side of the second current mirror and an input side of the third current mirror, so that output currents of the output side of the second current mirror and the output side of the third current mirror are the same as that of the input side of the first current mirror.

In a possible design, the PMOS tube replication circuit includes a first PMOS tube, a second PMOS tube and a third PMOS tube;

where a gate of the first PMOS tube is connected with the output side of the operational amplifier, a collector of the first PMOS tube is connected with one end of the first resistance, and the other end of the first resistance is grounded; and a gate of the second PMOS tube and a gate of the third PMOS tube are respectively connected with the gate of the first PMOS tube, so that currents output by a collector of the second PMOS tube and a collector of the third PMOS tube are the same as that input to the gate of the first PMOS tube.

In a possible design, the current subtracting circuit is a current subtractor circuit or an input common-mode control circuit.

In a possible design, the charge amplifying circuit is connected with a programmable gain amplifier PGA circuit or an integrator circuit.

In a second aspect, the present disclosure further provides a touch control chip which includes: any one optional capacitance detecting circuit in the first aspect.

In a third aspect, the present disclosure further provides a touch detection apparatus which includes: any one optional capacitance detecting circuit in the first aspect, and the touch detection apparatus determines a trigger position according to capacitance values of each capacitor determined by the capacitance detecting circuit.

In a fourth aspect, the present disclosure further provides an electronic device which includes: the touch detection apparatus as described in the third aspect.

The capacitance detecting circuit, the touch control chip, the touch detection apparatus and the electronic device are provided by the present disclosure, by configuring the first input side of the operational amplifier as a preset voltage, and utilizing the same characteristics of voltages at the two input sides of the operational amplifier, an output voltage in a touch sensor is configured as a preset voltage by a second input side of the operational amplifier, so that the preset voltage is set as a fixed voltage during mutual-capacitance detection to fix an upper plate voltage of the induction capacitor. Therefore, all current signals flowing through a coupling capacitor flow into the second input side of the operational amplifier, so as to prevent loss of signal amount of the current signals passing through the coupling capacitor on a corresponding induction capacitor. In addition, during a self-capacitance detection, the preset voltage is set as a self-capacitance coding voltage to synchronize the upper plate voltage of the induction capacitor to the self-capacitance coding voltage, so that all the current signals flowing through the induction capacitor flow into the second input side of the operational amplifier, so as to prevent the loss of the signal amount of the current signals passing through the induction capacitor on a corresponding coupling capacitor. It can be seen that the capacitance detecting circuit provided by the embodiment can realize mutual-capacitance and self-capacitance detection with a same circuit by changing a driving position of the coding voltage. In addition, the output side of the operational amplifier is connected with the input side of the current signal replication circuit to replicate a single-channel current signal output by the operational amplifier into a multi-channel current signal, and then a current subtracting circuit is used to determine a differential signal of current signals output by two adjacent channels, the differential signal is converted into a voltage through a charge amplifying circuit, and the voltage is amplified for ADC sampling output, so that a full channel mutual-capacitance differential signal can be read at the same time without losing a refresh rate. Finally, after analog-to-digital conversion, a touch position is determined by a processing circuit.

BRIEF DESCRIPTION OF DRAWINGS

In order to describe the technical solutions in embodiments of the present disclosure or in the related art more clearly, the accompanying drawings required for describing the embodiments or the related art are briefly introduced in the following. Apparently, the accompanying drawings in the following description are some embodiments of the present disclosure, and persons of ordinary skilled in the art may still derive other drawings from these accompanying drawings without creative effort.

Figure 1A:
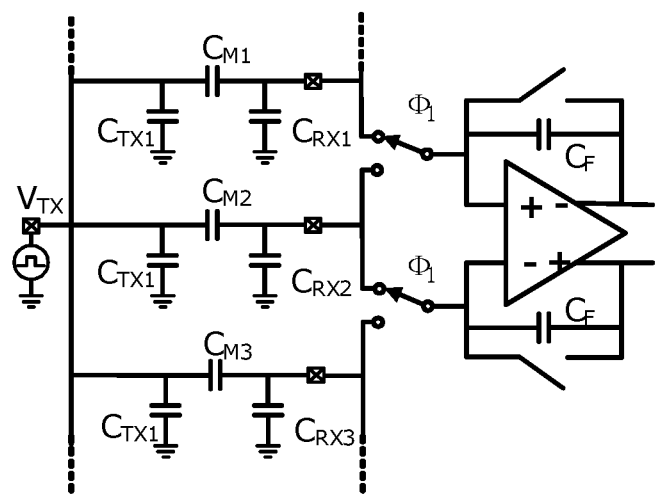
FIGS. 1A-1B are schematic structural diagrams of a capacitance detecting circuit according to the related art.

Through the above accompanying drawings, specific embodiments of the present disclosure have been shown, which will be described in more detail later. These accompanying drawings and textual descriptions are not intended to limit the scope of the concept of the present disclosure in any way, but to explain the concept of the present disclosure to those skilled in the art by referring to specific embodiments.

DETAILED DESCRIPTION OF THE EMBODIMENTS

In order to make objectives, technical solutions and advantages in embodiments of the present disclosure clearer, technical solutions in the embodiments of the present disclosure will be described clearly and completely below in combination with the accompanying drawings in the embodiments of the present disclosure. Apparently, the described embodiments are merely a part rather than all embodiments of the present disclosure. All other embodiments obtained by persons of ordinary skilled in the art based on embodiments of the present disclosure without paying creative effort shall fall within the protection scope of the present disclosure.

The terms "first", "second", "third", "fourth" and the like (if any) in the description, claims and the accompanying drawings of the present disclosure are used to distinguish similar objects, and are not necessarily used to describe a specific order or sequence. It should be understood that data used in this way can be interchanged under appropriate circumstances, so that the embodiments of the present disclosure described herein can be implemented, for example, in a sequence other than those illustrated or described herein. In addition, the terms "include" and "have" and any variation of them are intended to cover non-exclusive inclusion. For example, a process, method, system, product or device that contains a series of steps or units need not be limited to those steps or units clearly listed, but may include other steps or units that are not clearly listed or are inherent to these processes, methods, products or devices.

With the rapid development of electronic technologies, capacitive sensors have a wide application prospect in touch smart terminals (such as mobile phones, tablets, computers and other smart mobile terminals). In a capacitive sensor, a capacitance value will change with touch. Through a capacitance detecting circuit, a change of the capacitance value will be read out, so that a smart terminal can judge a user's operation, thereby achieving a better human-computer interaction experience. However, with an increase of screen size applied by the smart terminal and an update of screen-body technology, a capacitance value of a touch screen is increasing. Under a larger capacitance value, how to realize capacitance detection is currently an urgent problem to be solved.

In order to increase a sensitivity of capacitance change measurement, the voltage input to the touch screen capacitance often needs to be larger. At the same time capacitance change signal becomes larger, the detected capacitance signal of the touch screen itself also needs to become larger. At the same time, in order to improve a signal-to-noise ratio, it is often necessary to read multi-channel mutual-capacitance at the same time during a mutual-capacitance detection. Under this condition, a reading circuit is easy to be saturated. In order to prevent the saturation of the read circuit, a higher circuit dynamic range is required, which will lead to doubling increase of power consumption.

On the other hand, as a distance between the touch screen and a display screen is getting closer, and an increase of a capacitance of the touch screen itself will couple a greater display screen interference, which will also saturate a front-side circuit. To avoid front-side circuit saturation, a larger dynamic range is also required, but this will not only double the power consumption, but also make most of the read and stored data is useless interference signals for human-computer interaction applications, or is large capacitance signals of the screen itself. However, in the related art, in order to achieve higher efficiency of reading circuit and storing effective information, it is necessary to avoid a demand of a large dynamic range.

Figure 1B:
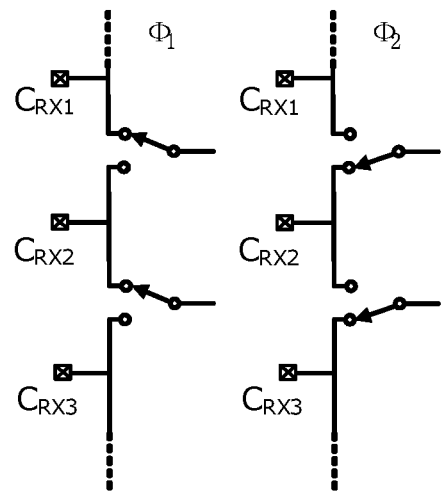

FIGS. 1A-1B are schematic structural diagrams of a capacitance detecting circuit according to the related art. As shown in FIGS. 1A-1B, a capacitance touch control system can include a driving channel layer (TX layer) and an induction channel layer (RX layer). The TX layer includes a plurality of TX channels, and driving capacitances of TX channels to the ground can include: $C_{TX1}$, $C_{TX2}$, $C_{TX3}$, etc. The RX layer includes a plurality of RX channels, and induction capacitances of the RX channels to the ground, can include: $C_{RX1}$, $C_{RX2}$, $C_{RX3}$, etc. There is a mutual-capacitance $C_{M1}$ between $C_{TX1}$ and $C_{RX1}$, a mutual-capacitance $C_{M2}$ between $C_{TX1}$ and $C_{RX2}$, and a coupling capacitor $C_{M3}$ between $C_{TX1}$ and $C_{RX3}$.

Specifically, a fully differential circuit front-side of adjacent reading channels is adopted. This circuit is respectively connected with adjacent touch screen capacitors at positive and negative sides of the differential, and amplifies currents or charges of a differential mode at both sides through a differential operational amplifier, so as to suppress common-mode signal, interference and noise. Since interference affected by the display to adjacent channels are basically the same, and the capacitance of the touch screen itself corresponding to the adjacent channels is similar, then the interference of the display and the capacitance signal of the touch screen will be effectively suppressed as a common-mode, and the requirement of a dynamic range of the reading circuit will be greatly reduced. However, since this differential circuit requires adjacent channels to read at the same time, continue to refer to FIG. 1A-FIG. 1B, in a Φ1 state, a RX2 channel can only be differentiated with a RX1 channel adjacent to one side, while a RX3 channel adjacent to the other side needs to be differentiated in a Φ2 state. Therefore, this method often needs time-sharing to make two differences (that is, the Φ1 state and the Φ2 state) to obtain the difference of all adjacent channels, so as to save and restore capacitance changes of all channels. However, time-sharing reading will lose half of a refresh rate of touch screen signal reading, therefore, it is unacceptable in smart devices with a high refresh rate.

Figure 2:
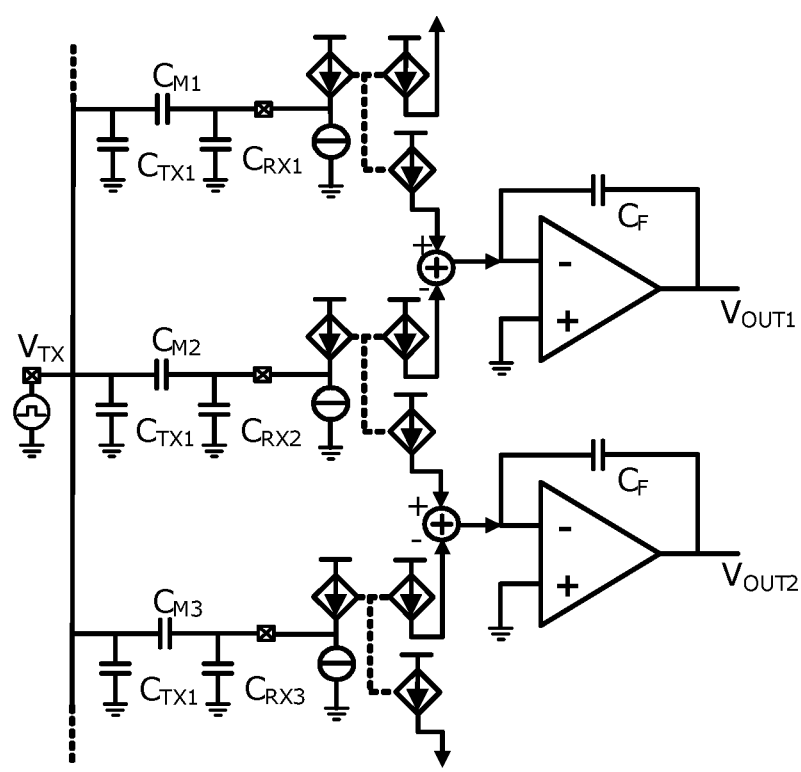
FIG. 2 is a schematic structural diagram of another capacitance detecting circuit according to the related art.

In order to ensure that the refresh rate will not be reduced, it is necessary to perform differential reading of all channels at the same time. FIG. 2 is a schematic structural diagram of another capacitance detecting circuit according to the related art. As shown in FIG. 2, this is a circuit for detecting a change of amount of mutual-capacitance signal. A current signal $i=V_{TX}sCM$ generated by TX side coding is replicated to two ways through a current mirror and they are connected to adjacent reading channels respectively, where s is an angular frequency of a coupling capacitor. Referring to FIG. 2, CM can be a capacitance value of a coupling capacitor $C_{M1}$, a capacitance value of a coupling capacitor $C_{M2}$, or a capacitance value of the coupling capacitor $C_{M3}$. Then, currents of adjacent channels can be subtracted at the same time, so that differential signals of all channels can be read at the same time, thereby obtaining the differential signals of all channels used for a restoration of single side signal amount of each channel or a positioning of touch detection.

However, continuing to refer to FIG. 2, the signal amount detected by this circuit will be much smaller than $i=V_{TX}sC_M$, because it is different from a structure of a traditional driving capacitor $C_{RX}$ with an upper plate connected to the amplifier, the total current $i=V_{TX}sC_M$ generated here will be divided into the driving capacitor $C_{RX}$, while on a larger and larger touch screen, the $C_{RX}$ will become larger and larger, and an impedance $1/(sC_{RX})$ will become smaller. Therefore, more currents will flow away from the driving capacitor $C_{RX}$ without entering a path of the current mirror, which results in obvious loss of signal amounts.

In view of the above problems, the embodiment of the present disclosure provides a capacitance detecting circuit, by configuring the first input side of the operational amplifier as a preset voltage, and utilizing the same characteristics of voltages at the two input sides of the operational amplifier, an output voltage in a touch sensor is configured as a preset voltage by a second input side of the operational amplifier, so that the preset voltage is set as a fixed voltage during mutual-capacitance detection to fix an upper plate voltage of the induction capacitor. Therefore, all current signals flowing through a coupling capacitor flow into the second input side of the operational amplifier, so as to prevent loss of the signal amount of the current signals passing through the coupling capacitor on a corresponding induction capacitor. In addition, during a self-capacitance detection, the preset voltage is set as a self-capacitance coding voltage to synchronize the upper plate voltage of the induction capacitor to the self-capacitance coding voltage, so that all the current signals flowing through the induction capacitor flow into the second input side of the operational amplifier, so as to prevent the loss of the signal amount of the current signals passing through the induction capacitor on a corresponding coupling capacitor. It can be seen that the capacitance detecting circuit provided by the embodiment can realize mutual-capacitance and self-capacitance detection with a same circuit by changing a driving position of the coding voltage. In addition, the output side of the operational amplifier is connected with the input side of the current signal replication circuit to replicate a single-channel current signal output by the operational amplifier into a multi-channel current signal, and then a current subtracting circuit is used to determine a differential signal of current signals (a current differential signal) output by two adjacent channels, and the differential signal is converted into a voltage through a charge amplifying circuit, and the voltage is amplified for ADC sampling output, so that a full channel mutual-capacitance differential signal can be read at the same time without losing a refresh rate. Finally, after analog-to-digital conversion, a touch position is determined by a processing circuit.

Figure 3:
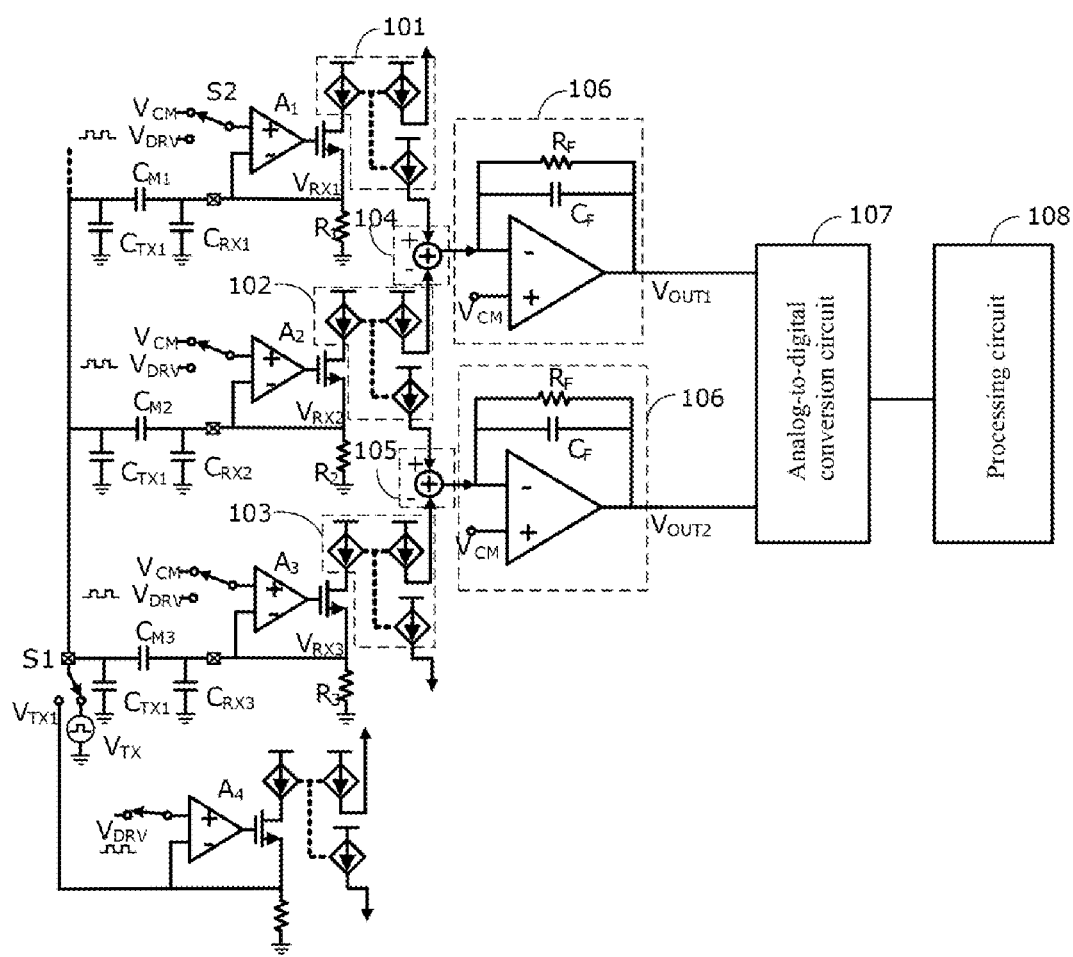
FIG. 3 is a schematic structural diagram of a capacitance detecting circuit according to an embodiment of the present disclosure.

FIG. 3 is a schematic structural diagram of a capacitance detecting circuit according to an embodiment of the present disclosure. As shown in FIG. 3, the capacitance detecting circuit provided by this embodiment includes: an operational amplifier, a current signal replication circuit, a current subtracting circuit, a charge amplifying circuit, an analog-to-digital conversion circuit and a processing circuit. A first input side of the operational amplifier is used to input a preset voltage, where the preset voltage is a fixed voltage or a self-capacitance coding voltage. A second input side of the operational amplifier is used to configure an output voltage in a touch sensor as the preset voltage, so that all current signals flowing through a coupling capacitor or an induction capacitor flow into the second input side of the operational amplifier, and the coupling capacitor is a capacitor between an induction electrode and a driving electrode.

An output side of the operational amplifier is connected with an input side of the current signal replication circuit which is used to replicate a single-channel current signal output by the operational amplifier into a multi-channel current signal. One output side of the current signal replication circuit is connected with an input side of the current subtracting circuit which is used to determine a differential signal of current signals output by two adjacent channels. In addition, an output side of the current subtracting circuit is connected with the charge amplifying circuit, where the charge amplifying circuit is used to convert the differential signal into a voltage, amplify the voltage and then input an amplified voltage to the analog-to-digital conversion circuit, so as to determine capacitance values of each capacitor in the touch sensor through the processing circuit after analog-to-digital conversion.

In the embodiment, by configuring the first input side of the operational amplifier as a preset voltage, and utilizing the same characteristics of voltages at the two input sides of the operational amplifier, an output voltage in a touch sensor is configured as a preset voltage by a second input side of the operational amplifier, so that the preset voltage is set as a fixed voltage during mutual-capacitance detection to fix an upper plate voltage of the induction capacitor. Therefore, all current signals flowing through a coupling capacitor flow into the second input side of the operational amplifier, so as to prevent loss of the signal amount of the current signals passing through the coupling capacitor on a corresponding induction capacitor. In addition, during a self-capacitance detection, the preset voltage is set as a self-capacitance coding voltage to synchronize the upper plate voltage of the induction capacitor to the self-capacitance coding voltage, so that all the current signals flowing through the induction capacitor flow into the second input side of the operational amplifier, so as to prevent the loss of the signal amount of the current signals passing through the induction capacitor on a corresponding coupling capacitor. It can be seen that the capacitance detecting circuit provided by the embodiment can realize mutual-capacitance and self-capacitance detection with a same circuit by changing a driving position of the coding voltage. In addition, the output side of the operational amplifier is connected with the input side of the current signal replication circuit to replicate a single-channel current signal output by the operational amplifier into a multi-channel current signal, and then a current subtracting circuit is used to determine a differential signal of current signals output by two adjacent channels, the differential signal is converted into a voltage through a charge amplifying circuit, and the voltage is amplified for ADC sampling output, so that a full channel mutual-capacitance differential signal can be read at the same time without losing a refresh rate. Finally, after analog-to-digital conversion, a touch position of an object on a touch screen is determined by a processing circuit.

In the touch sensor, driving capacitances of a driving channel to the ground can include: a first driving capacitance $C_{TX1}$, a second driving capacitance $C_{TX2}$ (not shown in the figure), a third driving capacitance $C_{TX3}$ (not shown in the figure), etc. Induction capacitances of an induction channel to the ground can include: a first induction capacitance $C_{RX1}$, a second induction capacitance $C_{RX2}$, a third induction capacitance $C_{RX3}$, etc. Coupling capacitors coupled between a driving electrode and an induction electrode can include: a first coupling capacitor $C_{M1}$ coupled between the first driving electrode and a first induction electrode, a second coupling capacitor $C_{M2}$ coupled between the first driving electrode and a second induction electrode, the third coupling capacitor $C_{M3}$ coupled between the first driving electrode and a third induction electrode, etc.

In order to realize differential reading of all channels at the same time, it is necessary to perform differential processing on any two adjacent channels. In order to illustrate a mutual-capacitance detection principle of the capacitance detecting circuit provided by the embodiment, one driving capacitor (for example, the first driving capacitor $C_{TX1}$, and all first driving capacitors $C_{TX1}$ are connected in parallel to form a TX channel capacitor) and a detection circuit of three induction capacitors (the first induction capacitor $C_{RX1}$, the second induction capacitor $C_{RX2}$, and the third induction capacitor $C_{RX3}$) are illustratively illustrated.

Specifically, referring to FIG. 3, in a driving channel of the touch sensor, for example, a position between the first driving capacitor $C_{TX1}$ and the first coupling capacitor $C_{M1}$ is connected with a mutual-capacitance coding voltage input side $V_{TX}$, a position between the first driving capacitor $C_{TX1}$ and the second coupling capacitor $C_{M2}$ is connected with the mutual-capacitance coding voltage input side $V_{TX}$, and a position between the first driving capacitor $C_{TX1}$ and the third coupling capacitor $C_{M3}$ is connected with a mutual-capacitance coding voltage input side $V_{TX}$.

A position between the first induction capacitor $C_{RX1}$ and the first coupling capacitor $C_{M1}$ is connected with a second input side (e.g., a negative input side) of the first operational amplifier $A_1$, and a first input side (e.g., a positive input side) of the first operational amplifier $A_1$ is connected with the fixed voltage input side $V_{CM}$. Since the voltages of the two input sides of the first operational amplifier $A_1$ are the same, voltage $V_{RX1}$ between the first induction capacitor $C_{RX1}$ and the first coupling capacitor $C_{M1}$ is $V_{CM}$. It is worth noting that the voltage of the fixed voltage input side $V_{CM}$ can be determined according to the component characteristics in the current signal replication circuit and the output current, which can usually be about half of the driving voltage of the touch control chip.

A position between the second induction capacitor $C_{RX2}$ and the second coupling capacitor $C_{M2}$ is connected with a second input side (e.g., a negative input side) of the second operational amplifier $A_2$, and a first input side (e.g., a positive input side) of the second operational amplifier $A_2$ is connected with the fixed voltage input side $V_{CM}$. Since the voltages of the two input sides of the second operational amplifier $A_2$ are the same, voltage $V_{RX2}$ between the second induction capacitor $C_{RX2}$ and the second coupling capacitor $C_{M2}$ is $V_{CM}$.

A position between the third induction capacitor $C_{RX3}$ and the third coupling capacitor $C_{M3}$ is connected with a second input side (e.g., a negative input side) of the third operational amplifier $A_3$, and a first input side (e.g., a positive input side) of the third operational amplifier $A_3$ is connected with the fixed voltage input side $V_{CM}$. Since the voltages of the two input sides of the third operational amplifier $A_3$ are the same, voltage $V_{RX3}$ between the third induction capacitor $C_{RX3}$ and the third coupling capacitor $C_{M3}$ is $V_{CM}$.

It can be seen that plate voltages of the first induction capacitor $C_{RX1}$, the second induction capacitor $C_{RX2}$ and the third induction capacitor $C_{RX3}$ are fixed to $V_{CM}$. Therefore, the first induction capacitor $C_{RX1}$ will not divide a current from the first coupling capacitor $C_{M1}$, the second induction capacitor $C_{RX2}$ will not divide a current from the second coupling capacitor $C_{M2}$, and the third induction capacitor $C_{RX3}$ will not divide a current from the third coupling capacitor $C_{M3}$.

An output side of the first operational amplifier $A_1$ is connected with an input side of a first current signal replication circuit 101 which is used to replicate a single-channel current signal output by the first operational amplifier $A_1$ into a multi-channel current signal. An output side of the second operational amplifier $A_2$ is connected with an input side of a second current signal replication circuit 102 which is used to replicate a single-channel current signal output by the second operational amplifier $A_2$ into a multi-channel current signal. An output side of the third operational amplifier $A_3$ is connected with an input side of a third current signal replication circuit 103 which is used to replicate a single-channel current signal output by the third operational amplifier $A_3$ into a multi-channel current signal.

Then, an output side of a current signal replication circuit corresponding to two adjacent channels is connected with an input side of the current subtracting circuit. For example, one of current signals output by the output side of the first current signal replication circuit 101 and one of current signals output by the output side of the second current signal replication circuit 102 are input to a first current subtracting circuit 104, so as to determine a difference signal between a current signal output by a channel where the first coupling capacitor $C_{M1}$ is located and a current signal output by a channel where the second coupling capacitor $C_{M2}$ is located.

Similarly, one of current signals output by the output side of the second current signal replication circuit 102 and one of current signals output by the output side of the third current signal replication circuit 103 are input to a second current subtracting circuit 105, so as to determine a difference signal between the current signal output by the channel where the second coupling capacitor $C_{M2}$ is located and a current signal output by a channel where a third coupling capacitor $C_{M3}$ is located.

After the output side of the current subtracting circuit outputs a differential signal between adjacent channels, the differential signal is input to a charge amplifying circuit 106, so as to enable the charge amplifying circuit 106 to convert the differential signal into a voltage and amplify the voltage for being sampled and output by an analog-to-digital converter (Analog-to-Digital Converter, abbreviation: ADC) 107. The charge amplifying circuit 106 may be a programmable gain amplifier (Programmable Gain Amplifier, abbreviation: PGA) circuit or an integrator circuit. After analog-to-digital conversion, capacitance values of each capacitor in the touch sensor are determined by a processing circuit 108, so as to determine a trigger position according to determined capacitance values of each capacitor.

It can be seen that, by connecting a position between the driving capacitor and the coupling capacitor with the mutual-capacitance coding voltage input side, there is a connection between a position between the induction capacitor and the coupling capacitor with the second input side of the operational amplifier, establishing a connection between the first input side of the operational amplifier and the fixed voltage input side, and utilizing same characteristics of voltages at the two input sides of the operational amplifier to fix an upper plate voltage of the induction capacitor, so as to prevent loss of the signal amount of the current signals passing through the coupling capacitor on a corresponding induction capacitor. In addition, the output side of the operational amplifier is connected with the input side of the current signal replication circuit to replicate a single-channel current signal output by the operational amplifier into a multi-channel current signal, and then a current subtracting circuit is used to determine a differential signal of current signals output by two adjacent channels, the differential signal is converted into a voltage through a charge amplifying circuit, and the voltage is amplified for ADC sampling output, so that a full channel mutual-capacitance differential signal can be read at the same time without losing a refresh rate.

Continuing to refer to FIG. 3, the position between the first driving capacitor $C_{TX1}$ and the first coupling capacitor $C_{M1}$ can also be connected with a first switch $S_1$ which is used to select a detection coding voltage of a driving channel During a mutual-capacitance detection, the first switch $S_1$ is in a first state. At this time, the position between the first driving capacitor $C_{TX1}$ and the first coupling capacitor $C_{M1}$ is connected with the mutual-capacitance coding voltage input side $V_{TX}$, and a position between the first driving capacitor $C_{TX1}$ and the second coupling capacitor $C_{M2}$ is connected with the mutual-capacitance coding voltage input side $V_{TX}$, a position between the first driving capacitor $C_{TX1}$ and the third coupling capacitor $C_{M3}$ is connected with the mutual-capacitance coding voltage input side $V_{TX}$. Then, the mutual-capacitance coding voltage input side $V_{TX}$ applied to the electrode of the first driving capacitor $C_{TX1}$ generates currents through the first coupling capacitor $C_{M1}$, the second coupling capacitor $C_{M2}$ and the third coupling capacitor $C_{M3}$ are $i_1=V_{TX}sC_{M1}$, $i_2=V_{TX}sC_{M2}$, and $i_3=V_{TX}s_{CM3}$ respectively.

The first input side of the first operational amplifier $A_1$ is connected with a second switch $S_2$. When the second switch $S_2$ is in the first state, the first input side of the first operational amplifier $A_1$ is connected with a fixed voltage input side $V_{CM}$. The first input side of the second operational amplifier $A_2$ is connected with the second switch $S_2$. When the second switch $S_2$ is in the first state, the first input side of the second operational amplifier $A_2$ is connected with the fixed voltage input side $V_{CM}$. The first input side of the third operational amplifier $A_3$ is connected with the second switch $S_2$. When the second switch $S_2$ is in the first state, the first input side of the third operational amplifier $A_3$ is connected with the fixed voltage input side $V_{CM}$.

Since two input voltages of the operational amplifier are the same, the plate voltages of the first induction capacitor $C_{RX1}$, the second induction capacitor $C_{RX2}$ and the third induction capacitor $C_{RX3}$ are all fixed to $V_{CM}$. Therefore, the first induction capacitor $C_{RX1}$ will not divide the current from the first coupling capacitor $C_{M1}$, the second induction capacitor $C_{RX2}$ will not divide the current from the second coupling capacitor $C_{M2}$, and the third induction capacitor $C_{RX3}$ will not divide the current from the third coupling capacitor $C_{M3}$.

The current signal replication circuit above can be a current mirror replication circuit. Specifically, each current mirror replication circuit includes a first current mirror, a second current mirror and a third current mirror. An input side of the first current mirror is connected with a collector of a first field effect transistor, a gate of the first field effect transistor is connected with the output side of the operational amplifier $A_1$, a source of the first field effect transistor is connected with one end of a first resistance $R_1$, and the other end of the first resistance $R_1$ is grounded. And the driving side of the first current mirror is connected to a driving voltage of a chip. An output side of the first current mirror is respectively connected with an input side of the second current mirror and an input side of the third current mirror, so that an output currents of the output side of the second current mirror and the output side of the third current mirror are the same as that of the input side of the first current mirror.

Therefore, a current flowing through the first current signal replication circuit 101 is $I_{CM1}=V_{CM}/R_1-V_{TX}sC_{M1}$. Similarly, a current flowing through the second current signal replication circuit 102 is $I_{CM2}=V_{CM}/R_2-V_{TX}sC_{M2}$, and a current flowing through the third current signal replication circuit 103 is $I_{CM3}=V_{CM}/R_3-V_{TX}sC_{M3}$.

After currents on the current mirror are replicated by one time or adjustable N times respectively, currents of the two differential channels (for example, the channel where the first coupling capacitor $C_{M1}$ is located and the channel where the second coupling capacitor $C_{M2}$ is located) are subtracted by a current subtracting circuit (for example, a N-Metal-Oxide-Semiconductor (NMOS) tube) as follows: $I_{CM1}-I_{CM2}=N(V_{TX}sC_{M2}-V_{TX}sC_{M1})$. Currents of the other two differential channels (for example, the channel where the second coupling capacitor $C_{M2}$ is located and the channel where the third coupling capacitor $C_{M3}$ is located) are subtracted by the current subtracting circuit as follows: $I_{CM2}-I_{CM3}=N(V_{TX}sC_{M3}-V_{TX}sC_{M2})$.

Since the first resistance $R_1$, the second resistance $R_2$ and the third resistance $R_3$ are the same, and generally, the coupling capacitors of each channel (for example, the first coupling capacitor $C_{M1}$, the second coupling capacitor $C_{M2}$ and the third coupling capacitor $C_{M3}$) are the same when there is no finger touch. Then, $I_{CM1}-I_{CM2}=N(V_{TX}sC_{M2}-V_{TX}sC_{M1})=0$, $I_{CM2}-I_{CM3}=N(V_{TX}sC_{M3}-V_{TX}sC_{M2})=0$.

However, if the finger touches a junction of a channel TX1 where the first driving capacitor $C_{TX1}$ is located and a channel RX2 where the second induction capacitor $C_{RX2}$ is located, the second coupling capacitor $C_{M2}$ will decreases by $\Delta C_M$, while the coupling capacitors corresponding to other channels remain unchanged. Then at this time, $I_{CM1}-I_{CM2}=-NV_{TX}s\Delta C_M$, correspondingly, $I_{CM2}-I_{CM3}=NV_{TX}s\Delta C_M$. The differential signals $I_{CM1}-I_{CM2}$ and $I_{CM2}-I_{CM3}$ enter the charge amplifying circuit, are converted into voltage, and are amplified for ADC sampling output.

In addition, since the first coupling capacitor $C_{M1}$, the second coupling capacitor $C_{M2}$ and the third coupling capacitor $C_{M3}$ matched by the touch screen may also be slightly different, at this time, the current can be fine-tuned by adjusting the first resistance $R_1$, the second resistance $R_2$ and the third resistance $R_3$ to calibrate the differential current to 0 when there is no finger touch. However, in an actual circuit, due to the non-continuity of resistance adjustment, it is difficult to calibrate the differential current to 0 when there is no finger touch, or it may be that the differential current is calibrated within a preset required range when there is no finger touch.

Figure 4:
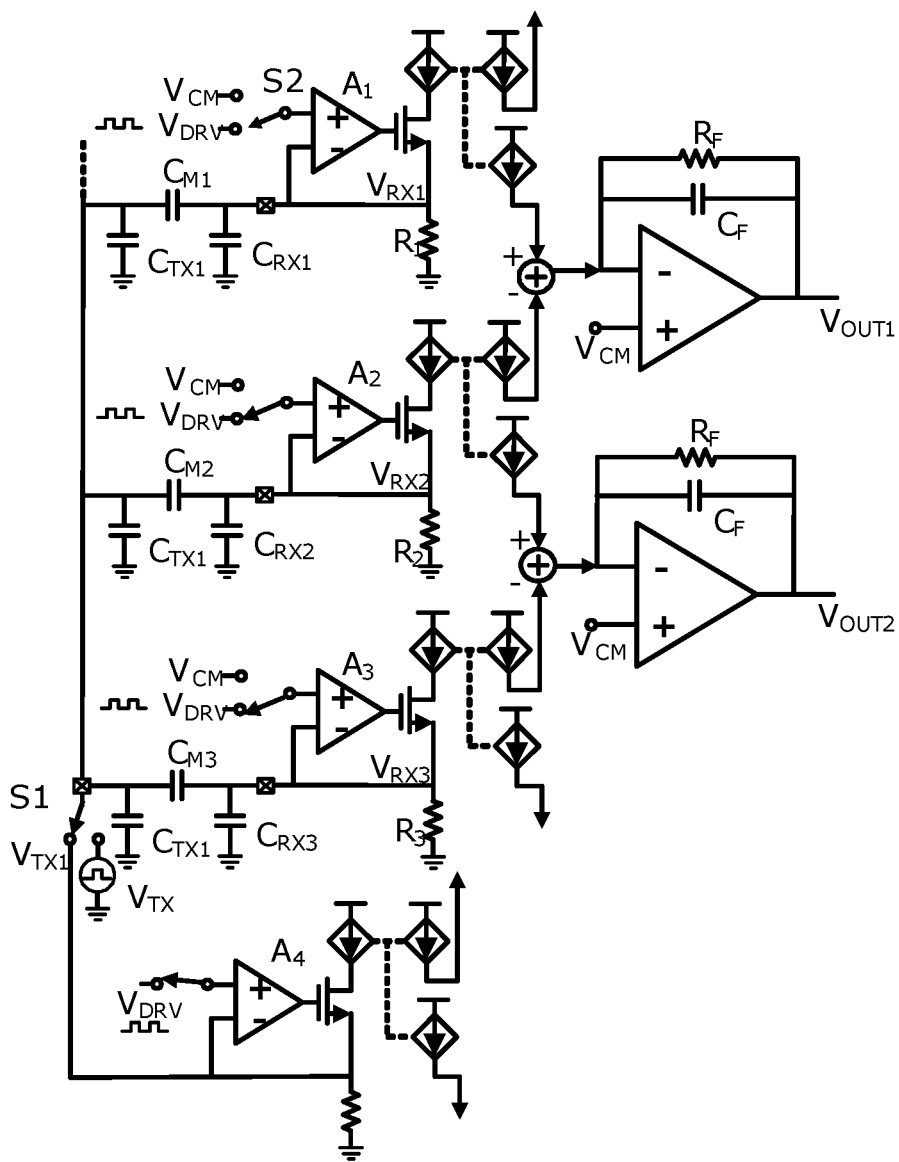
FIG. 4 is a schematic structural diagram of another working state of the capacitance detecting circuit of the embodiment shown in FIG. 3.

FIG. 4 is a schematic structural diagram of another working state of the capacitance detecting circuit of the embodiment shown in FIG. 3. As shown in FIG. 4, during a self-capacitance detection, when the first switch $S_1$ is in a second state, the first switch $S_1$ is switched to another voltage input side $V_{TX1}$. At this time, a position between the first driving capacitor $C_{TX1}$ and the first coupling capacitor $C_{M1}$ is connected with a self-capacitance coding voltage input side $V_{DRV}$, and the position between the first driving capacitor $C_{TX1}$ and the second coupling capacitor $C_{M2}$ is connected with the self-capacitance coding voltage input side $V_{DRV}$, and the position between the first driving capacitor $C_{TX1}$ and the third coupling capacitor $C_{M3}$ is connected with a self-capacitance coding voltage input side $V_{DRV}$. Alternatively, when the first switch $S_1$ is in the second state, the position between the first driving capacitor $C_{TX1}$ and the first coupling capacitor $C_{M1}$ is connected with a second input side of a fourth operational amplifier $A_4$, and a first input side of the fourth operational amplifier $A_4$ is connected with the self-capacitance coding voltage input side $V_{DRV}$.

In addition, the second switch $S_2$ of the first input side of the first operational amplifier $A_1$ is also turned to the second state. At this time, the first input side of the first operational amplifier $A_1$ is connected with the self-capacitance coding voltage input side $V_{DRV}$. The second switch $S_2$ of the first input side of the second operational amplifier $A_2$ is also turned to the second state. At this time, the first input side of the second operational amplifier $A_2$ is connected with the self-capacitance coding voltage input side $V_{DRV}$. The second switch $S_2$ of the first input side of the third operational amplifier $A_3$ is also turned to the second state. At this time, the first input side of the third operational amplifier $A_3$ is connected with the self-capacitance coding voltage input side $V_{DRV}$.

Since the two input sides of the operational amplifier have the same voltage, the second input sides of the first operational amplifier $A_1$, the second operational amplifier $A_2$ and the third operational amplifier $A_3$ all select the self-capacitance coding voltage $V_{DRV}$, and the voltages $V_{RX1}$, $V_{RX2}$, $V_{RX3}$ of the first input sides of the first operational amplifier $A_1$, the second operational amplifier $A_2$ and the third operational amplifier $A_3$ will follow the self-capacitance coding voltage $V_{DRV}$. Therefore, the currents on the first induction capacitor $C_{RX1}$, the second induction capacitor $C_{RX2}$ and the third induction capacitor $C_{RX3}$ are $i_1=V_{DRV}sC_{RX1}$, $i_2=V_{DRV}sC_{RX2}$, and $i_3=V_{DRV}sC_{RX3}$, respectively. Since a TX1 electrode is switched to $V_{TX1}$ and follows a voltage change of the self-capacitance coding voltage $V_{DRV}$ like RX1, then electrode voltages at both sides of the first coupling capacitor $C_{M1}$ are the same, so that the current flowing through the first induction capacitor $C_{RX1}$ will not be generated to affect a signal on the current mirror. Similarly, the electrode voltages at both sides of the second coupling capacitor $C_{M2}$ are the same, so that the current flowing through the second induction capacitor $C_{RX2}$ will not be generated, and the electrode voltages at both sides of the third coupling capacitor $C_{M3}$ are the same, so the current flowing through the third induction capacitor $C_{RX3}$ will not be generated.

After the current on the current mirror is replicated by one time or adjustable N times respectively, the current of two differential channels (for example, a channel where the first induction capacitor $C_{RX1}$ is located and the channel where the second induction capacitor $C_{RX2}$ is located) is subtracted by the current subtracting circuit as follows: $I_{CM1}-I_{CM2}=N(V_{DRV}sC_{RX1}-V_{DRV}sC_{RX2})$. Currents of the other two differential channels (for example, the channel where the second induction capacitor $C_{RX2}$ is located and a channel where the third induction capacitor $C_{RX3}$ is located) are subtracted by the current subtracting circuit as follows: $I_{CM2}-I_{CM3}=N(V_{DRV}sC_{RX2}-V_{DRV}sC_{RX3})$.

When there is no finger touch, $I_{CM1}-I_{CM2}=0$, $I_{CM2}-I_{CM3=0}$. However, if the finger touches the channel RX2, the second induction capacitor $C_{RX2}$ increases by $\Delta C_S$, then $I_{CM1}-I_{CM2}=-NV_{DRV}s\Delta C_S$, correspondingly, $I_{CM2}-I_{CM3}=NV_{DRV}s\Delta C_S$. The current differences $I_{CM1}-I_{CM2}$ and $I_{CM2}-I_{CM3}$ enter the charge amplifying circuit, are converted into voltage, and are amplified for ADC sampling output.

It can be seen that in the embodiment, by connecting the first switch at a position between the driving capacitor and the coupling capacitor, connecting the second switch at the first input side of the first operational amplifier, and by switching the switching states of the first switch and the second switch, so that when the switch is in the first state, a position between the driving capacitor and the coupling capacitor are connected with the mutual-capacitance coding voltage input side, and the first input side of the operational amplifier is connected with the fixed voltage input side to realize the circuit mutual-capacitance detection. When the switch is in the second state, a position between the driving capacitor and the coupling capacitor are connected with the self-capacitance coding voltage input side, and the first input side of the operational amplifier is also connected with the self-capacitance coding voltage input side to realize the circuit self-capacitance detection. In short, the capacitance detecting circuit provided by the embodiment changes the position of the coding voltage drive by changing the position of the switch, so as to realize mutual-capacitance and self-capacitance detection with a same circuit.

Figure 5:
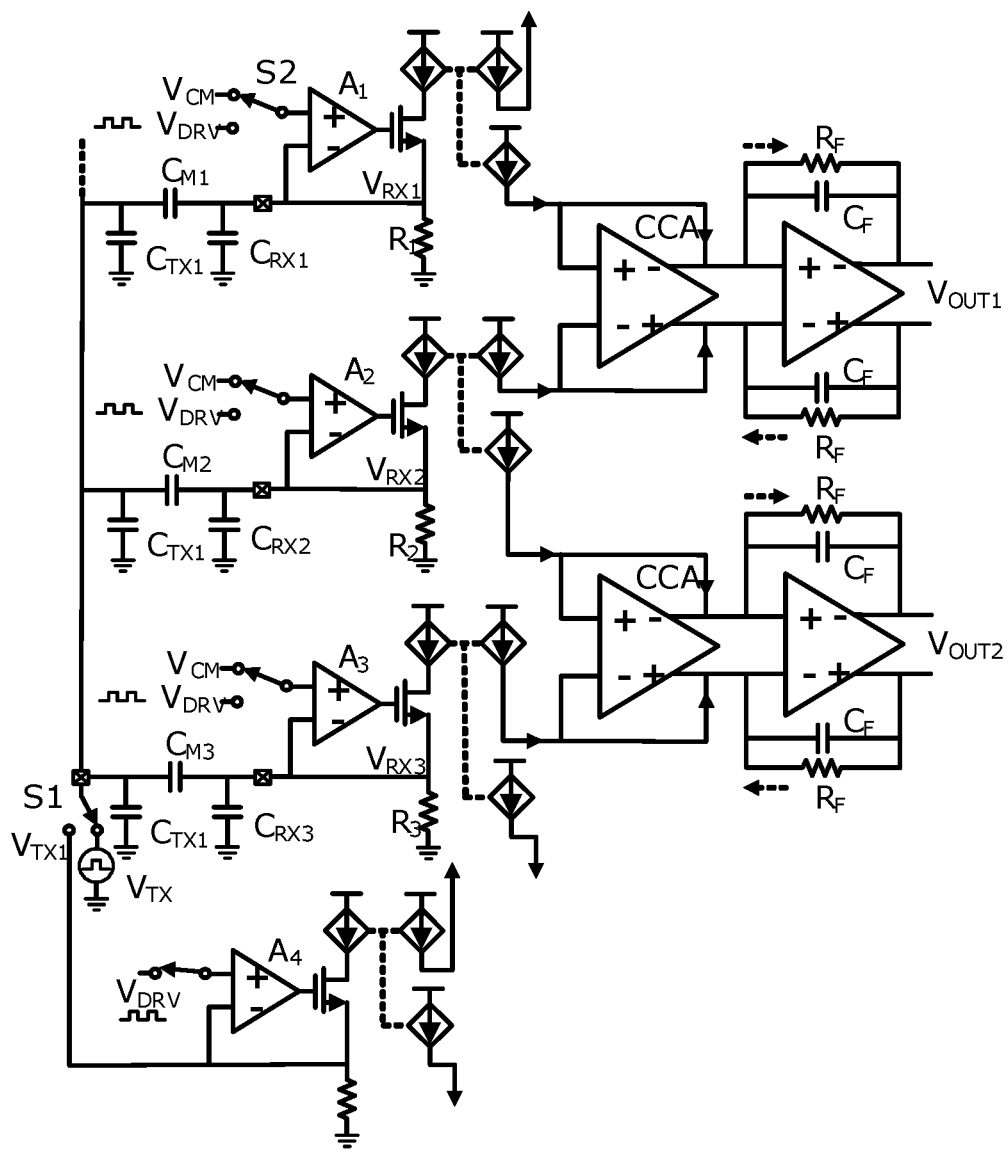
FIG. 5 is a schematic structural diagram of a capacitance detecting circuit of according to another embodiment of the present disclosure.

FIG. 5 is a schematic structural diagram of a capacitance detecting circuit of according to another embodiment of the present disclosure. As shown in FIG. 5, in the capacitance detecting circuit provided by the embodiment, a detection circuit of one driving capacitor (first driving capacitor $C_{TX1}$) and three induction capacitors (first induction capacitor $C_{RX1}$, second induction capacitor $C_{RX2}$ and third induction capacitor $C_{RX3}$) can be selected for exemplary description.

Specifically, as shown in FIG. 5, a position between the first driving capacitor $C_{TX1}$ and the first coupling capacitor $C_{M1}$ is connected with a mutual-capacitance coding voltage input side $V_{TX}$, a position between the first driving capacitor $C_{TX1}$ and the second coupling capacitor $C_{M2}$ is connected with the mutual-capacitance coding voltage input side $V_{TX}$, and a position between the first driving capacitor $C_{TX1}$ and the third coupling capacitor $C_{M3}$ is connected with the mutual-capacitance coding voltage input side $V_{TX}$.

A position between the first induction capacitor $C_{RX1}$ and the first coupling capacitor $C_{M1}$ is connected with a second input side (e.g., a negative input side) of the first operational amplifier $A_1$, and a first input side (e.g., a positive input side) of the first operational amplifier $A_1$ is connected with the fixed voltage input side $V_{CM}$. Since the voltages of the two input sides of the first operational amplifier $A_1$ are the same, voltage $V_{RX1}$ between the first induction capacitor $C_{RX1}$ and the first coupling capacitor $C_{M1}$ is $V_{CM}$.

A position between the second induction capacitor $C_{RX2}$ and the second coupling capacitor $C_{M2}$ is connected with a second input side (e.g., a negative input side) of the second operational amplifier $A_2$, and a first input side (e.g., a positive input side) of the second operational amplifier $A_2$ is connected with the fixed voltage input side $V_{CM}$. Since the voltages of the two input sides of the second operational amplifier $A_2$ are the same, voltage $V_{RX2}$ between the second induction capacitor $C_{RX2}$ and the second coupling capacitor $C_{M2}$ is $V_{CM}$.

A position between the third induction capacitor $C_{RX3}$ and the third coupling capacitor $C_{M3}$ is connected with a second input side (e.g., a negative input side) of the third operational amplifier $A_3$, and a first input side (e.g., a positive input side) of the third operational amplifier $A_3$ is connected with the fixed voltage input side $V_{CM}$. Since the voltages of the two input sides of the third operational amplifier $A_3$ are the same, voltage $V_{RX3}$ between the third induction capacitor $C_{RX3}$ and the third coupling capacitor $C_{M3}$ is $V_{CM}$.

A first switch $S_1$ is connected between the first driving capacitor $C_{TX1}$ and the first coupling capacitor $C_{M1}$. During a mutual-capacitance detection, the first switch $S_1$ is in the first state. At this time, the position between the first driving capacitor $C_{TX1}$ and the first coupling capacitor $C_{M1}$ is connected with the mutual-capacitance coding voltage input side $V_{TX}$, and a position between the first driving capacitor $C_{TX1}$ and the second coupling capacitor $C_{M2}$ is connected with the mutual-capacitance coding voltage input side $V_{TX}$, a position between the first driving capacitor $C_{TX1}$ and the third coupling capacitor $C_{M3}$ is connected with a mutual-capacitance coding voltage input side $V_{TX}$. Then, the mutual-capacitance coding voltage input side $V_{TX}$ applied to the electrode of the first driving capacitor $C_{TX1}$ generates currents through the first coupling capacitor $C_{M1}$, the second coupling capacitor $C_{M2}$ and the third coupling capacitor $C_{M3}$ are $i_1=V_{TX}sC_{M1}$, $i_2=V_{TX}sC_{M2}$, and $i_3=V_{TX}sC_{M3}$ respectively.

The first input side of the first operational amplifier $A_1$ is connected with a second switch $S_2$. When the second switch $S_2$ is in the first state, the first input side of the first operational amplifier $A_1$ is connected with a fixed voltage input side $V_{CM}$. The first input side of the second operational amplifier $A_2$ is connected with the second switch $S_2$. When the second switch $S_2$ is in the first state, the first input side of the second operational amplifier $A_2$ is connected with the fixed voltage input side $V_{CM}$. The first input side of the third operational amplifier $A_3$ is connected with the second switch $S_2$. When the second switch $S_2$ is in the first state, the first input side of the third operational amplifier $A_3$ is connected with the fixed voltage input side $V_{CM}$.

Since two input voltages of the operational amplifier are the same, the plate voltages of the first induction capacitor $C_{RX1}$, the second induction capacitor $C_{RX2}$ and the third induction capacitor $C_{RX3}$ are all fixed to $V_{CM}$. Therefore, the first induction capacitor $C_{RX1}$ will not divide the current from the first coupling capacitor $C_{M1}$, the second induction capacitor $C_{RX2}$ will not divide the current from the second coupling capacitor $C_{M2}$, and the third induction capacitor $C_{RX3}$ will not divide the current from the third coupling capacitor $C_{M3}$.

The current signal replication circuit above can be a current mirror replication circuit. Specifically, each current mirror replication circuit includes a first current mirror, a second current mirror and a third current mirror. An input side of the first current mirror is connected with a collector of a first field effect transistor, a gate of the first field effect transistor is connected with the output side of the operational amplifier $A_1$, a source of the first field effect transistor is connected with one end of a first resistance $R_1$, and the other end of the first resistance $R_1$ is grounded. And the driving side of the first current mirror is connected to a driving voltage of a chip. An output side of the first current mirror is respectively connected with an input side of the second current mirror and an input side of the third current mirror, so that an output currents of the output side of the second current mirror and the output side of the third current mirror are the same as that of the input side of the first current mirror.

Therefore, a current flowing through the first current signal replication circuit 101 is $I_{CM1}=V_{CM}/R_1-V_{TX}sC_{M1}$. Similarly, a current flowing through the second current signal replication circuit 102 is $I_{CM2}=V_{CM}/R_2-V_{TX}sC_{M2}$, and a current flowing through the third current signal replication circuit 103 is $I_{CM3}=V_{CM}/R_3-V_{TX}sC_{M3}$.

After currents on a PMOS tube are replicated by one time or adjustable N times respectively, currents of the two differential channels (for example, the channel where the first coupling capacitor $C_{M1}$ is located and the channel where the second coupling capacitor $C_{M2}$ is located) are subtracted by the current subtracting circuit as follows: $I_{CM1}-I_{CM2}=N(V_{TX}sC_{M2}-V_{TX}sC_{M1})$. Currents of the other two differential channels (for example, the channel where the second coupling capacitor $C_{M2}$ is located and the channel where the third coupling capacitor $C_{M3}$ is located) are subtracted by the current subtracting circuit as follows: $I_{CM2}-I_{CM3}=N(V_{TX}sC_{M3}-V_{TX}sC_{M2})$.

The above current subtracting circuit can be an input common-mode control circuit CCA, where the common-mode control circuit CCA can be used to absorb common-mode current, and the remaining differential-mode current passes through a differential charge amplifier. In the embodiment, a fully differential charge amplifier can be used, and the currents of the two differential channels flow from the positive and negative sides of the fully differential charge amplifier.

Since the first resistance $R_1$, the second resistance $R_2$ and the third resistance $R_3$ are the same, and generally, the coupling capacitors of each channel (for example, the first coupling capacitor $C_{M1}$, the second coupling capacitor $C_{M2}$ and the third coupling capacitor $C_{M3}$) are the same when there is no finger touch. Then, $I_{CM1}-I_{CM2}=N(V_{TX}sC_{M2}-V_{TX}sC_{M1})=0$, $I_{CM2}-I_{CM3}=N(V_{TX}sC_{M3}-V_{TX}sC_{M2})=0$.

However, if the finger touches a junction of a channel TX1 where the first driving capacitor $C_{TX1}$ is located and a channel RX2 where the second induction capacitor $C_{RX2}$ is located, the second coupling capacitor $C_{M2}$ will decreases by $\Delta C_M$, while the coupling capacitors corresponding to other channels remain unchanged. Then at this time, $I_{CM1}-I_{CM2}=-NV_{TX}s\Delta C_M$, correspondingly, $I_{CM2}-I_{CM3}=NV_{TX}s\Delta C_M$. The differential signals $I_{CM1}-I_{CM2}$ and $I_{CM2}-I_{CM3}$ enter the charge amplifying circuit, are converted into voltage, and are amplified for ADC sampling output. After analog-to-digital conversion, the capacitance values of each capacitor in the touch sensor are determined through a processing circuit, so as to determine a trigger position according to determined capacitance values of each capacitor.

In addition, since the first coupling capacitor $C_{M1}$, the second coupling capacitor $C_{M2}$ and the third coupling capacitor $C_{M3}$ matched by the touch screen may also be slightly different, at this time, the current can be fine-tuned by adjusting the first resistance $R_1$, the second resistance $R_2$ and the third resistance $R_3$ to calibrate the differential current to 0 when there is no finger touch.

Figure 6:
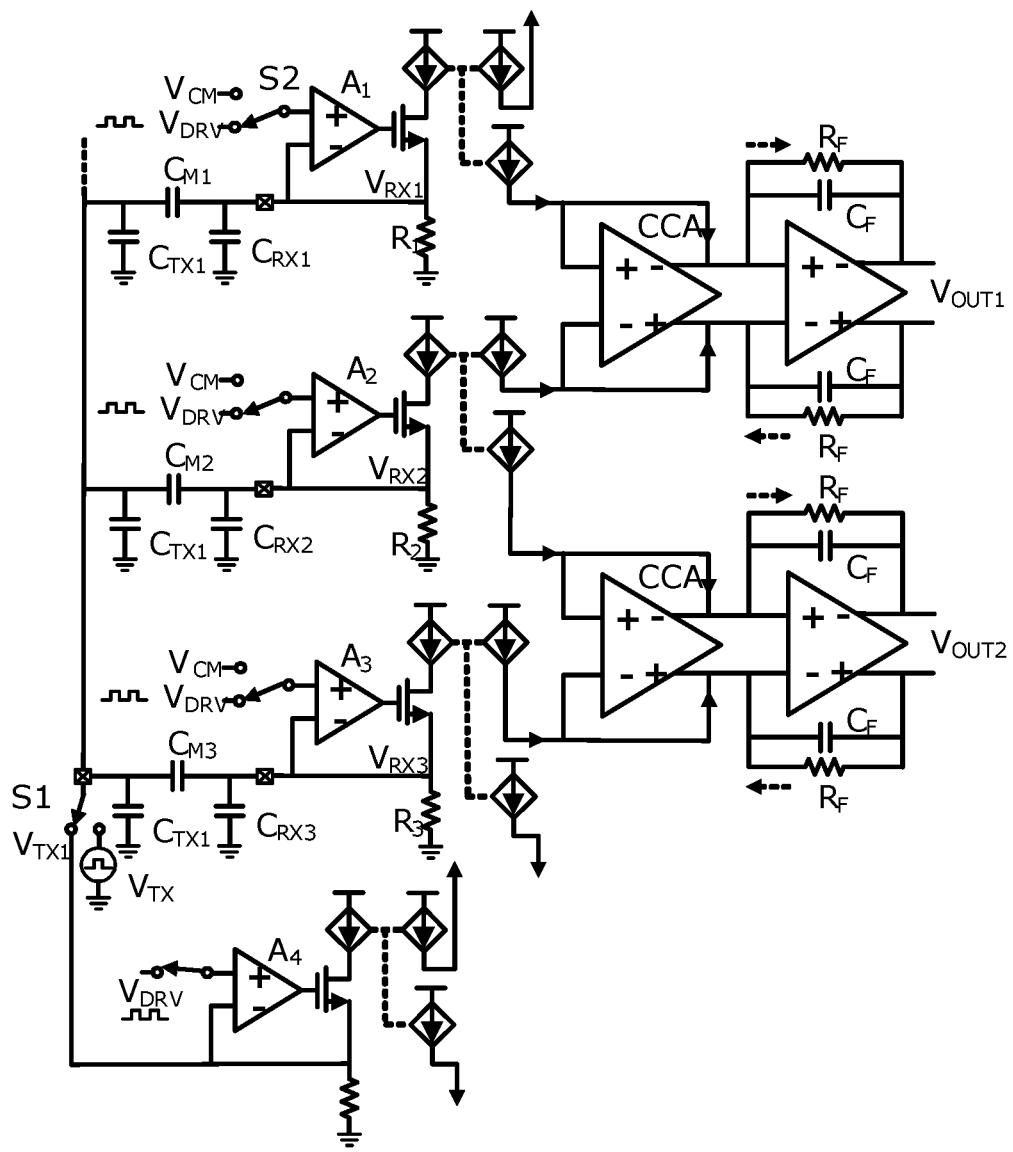
FIG. 6 is a schematic structural diagram of another working state of the capacitance detecting circuit of the embodiment shown in FIG. 5.

FIG. 6 is a schematic structural diagram of another working state of the capacitance detecting circuit of the embodiment shown in FIG. 5. As shown in FIG. 6, during a self-capacitance detection, when the first switch $S_1$ is in a second state, the first switch $S_1$ is switched to another voltage input side $V_{TX1}$. At this time, a position between the first driving capacitor $C_{TX1}$ and the first coupling capacitor $C_{M1}$ is connected with a self-capacitance coding voltage input side $V_{DRV}$, and the position between the first driving capacitor $C_{TX1}$ and the second coupling capacitor $C_{M2}$ is connected with the self-capacitance coding voltage input side $V_{DRV}$, and the first driving capacitor $C_{TX1}$ and the third coupling capacitor $C_{M3}$ is connected with a self-capacitance coding voltage input side $V_{DRV}$. Alternatively, when the first switch 51 is in the second state, the position between the first driving capacitor $C_{TX1}$ and the first coupling capacitor $C_{M1}$ is connected with a second input side of a fourth operational amplifier $A_4$, and a first input side of the fourth operational amplifier $A_4$ is connected with the self-capacitance coding voltage input side $V_{DRV}$.

In addition, the second switch $S_2$ of the first input side of the first operational amplifier $A_1$ is also turned to the second state. At this time, the first input side of the first operational amplifier $A_1$ is connected with the self-capacitance coding voltage input side $V_{DRV}$. The second switch $S_2$ of the first input side of the second operational amplifier $A_2$ is also turned to the second state. At this time, the first input side of the second operational amplifier $A_2$ is connected with the self-capacitance coding voltage input side $V_{DRV}$. The second switch $S_2$ of the first input side of the third operational amplifier $A_3$ is also turned to the second state. At this time, the first input side of the third operational amplifier $A_3$ is connected with the self-capacitance coding voltage input side $V_{DRV}$.

Since the two input sides of the operational amplifier have the same voltage, the second input sides of the first operational amplifier $A_1$, the second operational amplifier $A_2$ and the third operational amplifier $A_3$ all select the self-capacitance coding voltage $V_{DRV}$, and the voltages $V_{RX1}$, $V_{RX2}$, $V_{RX3}$ of the first input sides of the first operational amplifier $A_1$, the second operational amplifier $A_2$ and the third operational amplifier $A_3$ will follow the self-capacitance coding voltage $V_{DRV}$. Therefore, the currents on the first induction capacitor $C_{RX1}$, the second induction capacitor $C_{RX2}$ and the third induction capacitor $C_{RX3}$ are $i_1=V_{DRV}sC_{RX1}$, $i_2=V_{DRV}sC_{RX2}$, and $i_3=V_{DRV}sC_{RX3}$, respectively. Since a TX1 electrode is switched to $V_{TX1}$ and follows a voltage change of the self-capacitance coding voltage $V_{DRV}$ like RX1, then electrode voltages at both sides of the first coupling capacitor $C_{M1}$ are the same, and the current flowing through the first induction capacitor $C_{RX1}$ will not be generated to affect a signal on the current mirror. Similarly, the electrode voltages at both sides of the second coupling capacitor $C_{M2}$ are the same, the current flowing through the second induction capacitor $C_{RX2}$ will not be generated, and the electrode voltages at both sides of the third coupling capacitor $C_{M3}$ are the same, so the current flowing through the third induction capacitor $C_{RX3}$ will not be generated.

After the current on the current mirror is replicated by one time or adjustable N times respectively, the current of two differential channels (for example, a channel where the first induction capacitor $C_{RX1}$ is located and the channel where the second induction capacitor $C_{RX2}$ is located) absorb the common-mode current through the common-mode control circuit CCA as: $I_{CM1}-I_{CM2}=N(V_{DVR}sC_{RX1}-V_{DRV}sC_{RX2})$. Currents of the other two differential channels (for example, the channel where the second induction capacitor $C_{RX2}$ is located and a channel where the third induction capacitor $C_{RX3}$ is located) absorb the common-mode current through the common-mode control circuit CCA as: $I_{CM2}-I_{CM3}=N(V_{DRV}sC_{RX2}-V_{DRV}sC_{RX3})$. The differential signal output by the common-mode control circuit CCA after absorbing the common-mode current shown in FIG. 6 has lower noise than the differential signal output by directly subtracting the two currents by the current subtracting circuit shown in FIG. 4.

When there is no finger touch, $I_{CM1}-I_{CM2}=0$, $I_{CM2}-I_{CM3}=0$. However, if the finger touches the channel RX2, the second induction capacitor $C_{RX2}$ increases by $\Delta C_S$, then $I_{CM1}-I_{CM2}=-NV_{DRV}s\Delta C_S$, correspondingly, $I_{CM2}-I_{CM3}=NV_{DRV}s\Delta C_S$. The current differences $I_{CM1}-I_{CM2}$ and $I_{CM2}-I_{CM3}$ enter the charge amplifying circuit, are converted into voltage, and are amplified for ADC sampling output.

Figure 7:
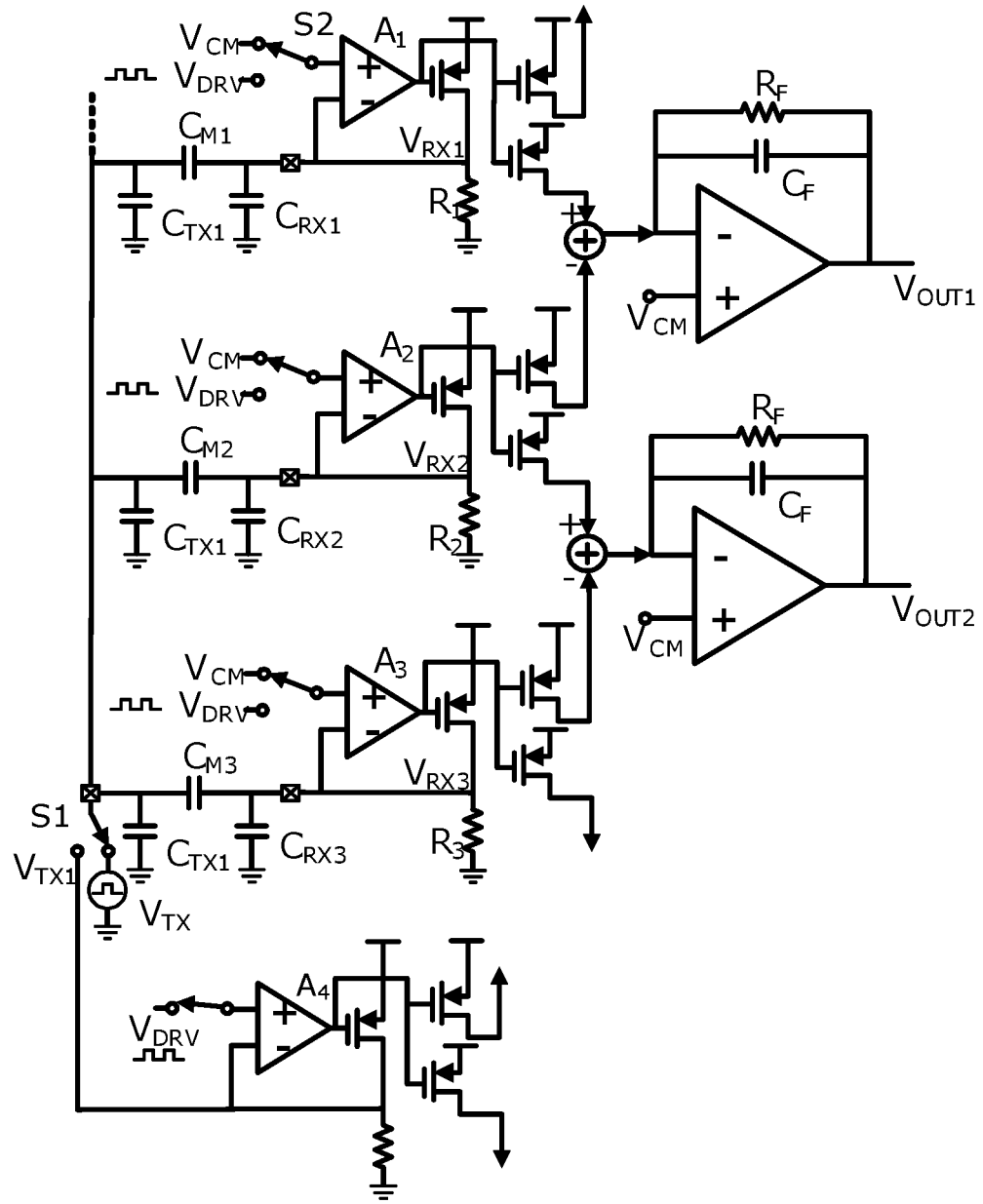
FIG. 7 is a schematic structural diagram of a capacitance detecting circuit according to a yet another embodiment of the present disclosure.

FIG. 7 is a schematic structural diagram of a capacitance detecting circuit according to a yet another embodiment of the present disclosure. As shown in FIG. 7, in the capacitance detecting circuit provided by the embodiment, a detection circuit of one driving capacitor (a first driving capacitor $C_{TX1}$) and three induction capacitors (a first induction capacitor $C_{RX1}$, a second induction capacitor $C_{RX2}$ and a third induction capacitor $C_{RX3}$) can be selected for exemplary description.

In order to realize differential reading of all channels at the same time, it is necessary to perform differential processing on any two adjacent channels. In order to illustrate a mutual-capacitance detection principle of the capacitance detecting circuit provided by the embodiment, the detection circuit of one driving capacitor (a first driving capacitor $C_{TX1}$) and three induction capacitors (a first induction capacitor $C_{RX1}$, a second induction capacitor $C_{RX2}$ and a third induction capacitor $C_{RX3}$) can be selected for exemplary description.

Specifically, as shown in FIG. 7, a position between the first driving capacitor $C_{TX1}$ and the first coupling capacitor $C_{M1}$ is connected with a mutual-capacitance coding voltage input side $V_{TX}$, a position between the second driving capacitor $C_{TX2}$ and the second coupling capacitor $C_{M2}$ is connected with a mutual-capacitance coding voltage input side $V_{TX}$, and a position between the third driving capacitor $C_{TX3}$ and the third coupling capacitor $C_{M3}$ is connected with a mutual-capacitance coding voltage input side $V_{TX}$. Where the first driving capacitor $C_{TX1}$ is any capacitor in a first capacitor set, the first induction capacitor $C_{RX1}$ is any capacitor in a second capacitor set, the second induction capacitor $C_{RX2}$ is an induction capacitor of an adjacent channel corresponding to the first induction capacitor $C_{RX1}$, and the third induction capacitor $C_{RX3}$ is an induction capacitor of an adjacent channel corresponding to the second induction capacitor $C_{RX2}$.

A position between the first induction capacitor $C_{RX1}$ and the first coupling capacitor $C_{M1}$ is connected with a second input side (e.g., a negative input side) of the first operational amplifier $A_1$, and a first input side (e.g., a positive input side) of the first operational amplifier $A_1$ is connected with the fixed voltage input side $V_{CM}$. Since the voltages of the two input sides of the first operational amplifier $A_1$ are the same, voltage $V_{RX1}$ between the first induction capacitor $C_{RX1}$ and the first coupling capacitor $C_{M1}$ is $V_{CM}$.

A position between the second induction capacitor $C_{RX2}$ and the second coupling capacitor $C_{M2}$ is connected with a second input side (e.g., a negative input side) of the second operational amplifier $A_2$, and a first input side (e.g., a positive input side) of the second operational amplifier $A_2$ is connected with the fixed voltage input side $V_{CM}$. Since the voltages of the two input sides of the second operational amplifier $A_2$ are the same, voltage $V_{RX2}$ between the second induction capacitor $C_{RX2}$ and the second coupling capacitor $C_{M2}$ is $V_{CM}$.

A position between the third induction capacitor $C_{RX3}$ and the third coupling capacitor $C_{M3}$ is connected with a second input side (e.g., a negative input side) of the third operational amplifier $A_3$, and a first input side (e.g., a positive input side) of the third operational amplifier $A_3$ is connected with the fixed voltage input side $V_{CM}$. Since the voltages of the two input sides of the third operational amplifier $A_3$ are the same, voltage $V_{RX3}$ between the third induction capacitor $C_{RX3}$ and the third coupling capacitor $C_{M3}$ is $V_{CM}$.

A first switch $S_1$ is connected with a position between the first driving capacitor $C_{TX1}$ and the first coupling capacitor $C_{M1}$. During a mutual-capacitance detection, the first switch $S_1$ is in the first state. At this time, the position between the first driving capacitor $C_{TX1}$ and the first coupling capacitor $C_{M1}$ is connected with the mutual-capacitance coding voltage input side $V_TX$, and a position between the first driving capacitor $C_{TX1}$ and the second coupling capacitor $C_{M2}$ is connected with the mutual-capacitance coding voltage input side $V_{TX}$, a position between the first driving capacitor $C_{TX1}$ and the third coupling capacitor $C_{M3}$ is connected with a mutual-capacitance coding voltage input side $V_{TX}$. Then, the mutual-capacitance coding voltage input side $V_{TX}$ applied to the electrode of the first driving capacitor $C_{TX1}$ generates currents through the first coupling capacitor $C_{M1}$, the second coupling capacitor $C_{M2}$ and the third coupling capacitor $C_{M3}$ are $i_1=V_{TX}sC_{M1}$, $i_2=V_{TX}sC_{M2}$, and $i_3=V_{TX}sC_{M3}$ respectively.

The first input side of the first operational amplifier $A_1$ is connected with a second switch $S_2$. When the second switch $S_2$ is in the first state, the first input side of the first operational amplifier $A_1$ is connected with a fixed voltage input side $V_{CM}$. The first input side of the second operational amplifier $A_2$ is connected with the second switch $S_2$. When the second switch $S_2$ is in the first state, the first input side of the second operational amplifier $A_2$ is connected with the fixed voltage input side $V_{CM}$. The first input side of the third operational amplifier $A_3$ is connected with the second switch $S_2$. When the second switch $S_2$ is in the first state, the first input side of the third operational amplifier $A_3$ is connected with the fixed voltage input side $V_{CM}$.

Since two input voltages of the operational amplifier are the same, the plate voltages of the first induction capacitor $C_{RX1}$, the second induction capacitor $C_{RX2}$ and the third induction capacitor $C_{RX3}$ are all fixed to $V_{CM}$. Therefore, the first induction capacitor $C_{RX1}$ will not divide the current from the first coupling capacitor $C_{M1}$, the second induction capacitor $C_{RX2}$ will not divide the current from the second coupling capacitor $C_{M2}$, and the third induction capacitor $C_{RX3}$ will not divide the current from the third coupling capacitor $C_{M3}$.

The current signal replication circuit can be a PMOS tube replication circuit. Specifically, each PMOS control circuit includes a first PMOS tube, a second PMOS tube and a third PMOS tube. Specifically, a gate of the first PMOS tube is connected with an output side of the first operational amplifier, a collector of the first PMOS tube is connected with one side of the first resistance $R_1$, and the other end of the first resistance $R_1$ is grounded. A gate of the second PMOS tube and a gate of the third PMOS tube are respectively connected with the gate of the first PMOS tube, so that currents output by a collector of the second PMOS tube and a collector of the third PMOS tube are the same as that input to the gate of the first PMOS tube.

Therefore, a current flowing through the first current signal replication circuit 101 is $I_{CM1}=V_{CM}/R_1-V_{TX}sC_{M1}$. Similarly, a current flowing through the second current signal replication circuit 102 is $I_{CM2}=V_{CM}/R_2-V_{TX}sC_{M2}$, and a current flowing through the third current signal replication circuit 103 is $I_{CM3}=V_{CM}/R_3-V_{TX}sC_{M3}$.

After currents on a PMOS tube are replicated by one time or adjustable N times respectively, currents of the two differential channels (for example, the channel where the first coupling capacitor $C_{M1}$ is located and the channel where the second coupling capacitor $C_{M2}$ is located) are subtracted by the current subtracting circuit as follows: $I_{CM1}-I_{CM2}=N(V_{TX}sC_{M2}-V_{TX}sC_{M1})$. Currents of the other two differential channels (for example, the channel where the second coupling capacitor $C_{M2}$ is located and the channel where the third coupling capacitor $C_{M3}$ is located) are subtracted by the current subtracting circuit as follows: $I_{CM2}-I_{CM3}=N(V_{TX}sC_{M3}-V_{TX}sC_{M2})$.

Since the first resistance $R_1$, the second resistance $R_2$ and the third resistance $R_3$ are the same, and generally, the coupling capacitors of each channel (for example, the first coupling capacitor $C_{M1}$, the second coupling capacitor $C_{M2}$ and the third coupling capacitor $C_{M3}$) are the same when there is no finger touch. Then, $I_{CM1}-I_{CM2}=N(V_{TX}sC_{M2}-V_{TX}sC_{M1})=0$, $I_{CM2}-I_{CM3}=N(V_{TX}sC_{M3}-V_{TX}sC_{M2})=0$.

However, if the finger touches a junction of a channel TX1 where the first driving capacitor $C_{TX1}$ is located and a channel RX2 where the second induction capacitor $C_{RX2}$ is located, the second coupling capacitor $C_{M2}$ will decreases by $\Delta C_M$, while the coupling capacitors corresponding to other channels remain unchanged. Then at this time, $I_{CM1}-I_{CM2}=-NV_{TX}s\Delta C_M$, correspondingly, $I_{CM2}-I_{CM3}=NV_{TX}s\Delta C_M$. The differential signals $I_{CM1}-I_{CM2}$ and $I_{CM2}-I_{CM3}$ enter the charge amplifying circuit, are converted into voltage, and are amplified for ADC sampling output.

In addition, since the first coupling capacitor $C_{M1}$, the second coupling capacitor $C_{M2}$ and the third coupling capacitor $C_{M3}$ matched by the touch screen may also be slightly different, at this time, the current can be fine-tuned by adjusting the first resistance $R_1$, the second resistance $R_2$ and the third resistance $R_3$ to calibrate the differential current to 0 when there is no finger touch.

Figure 8:
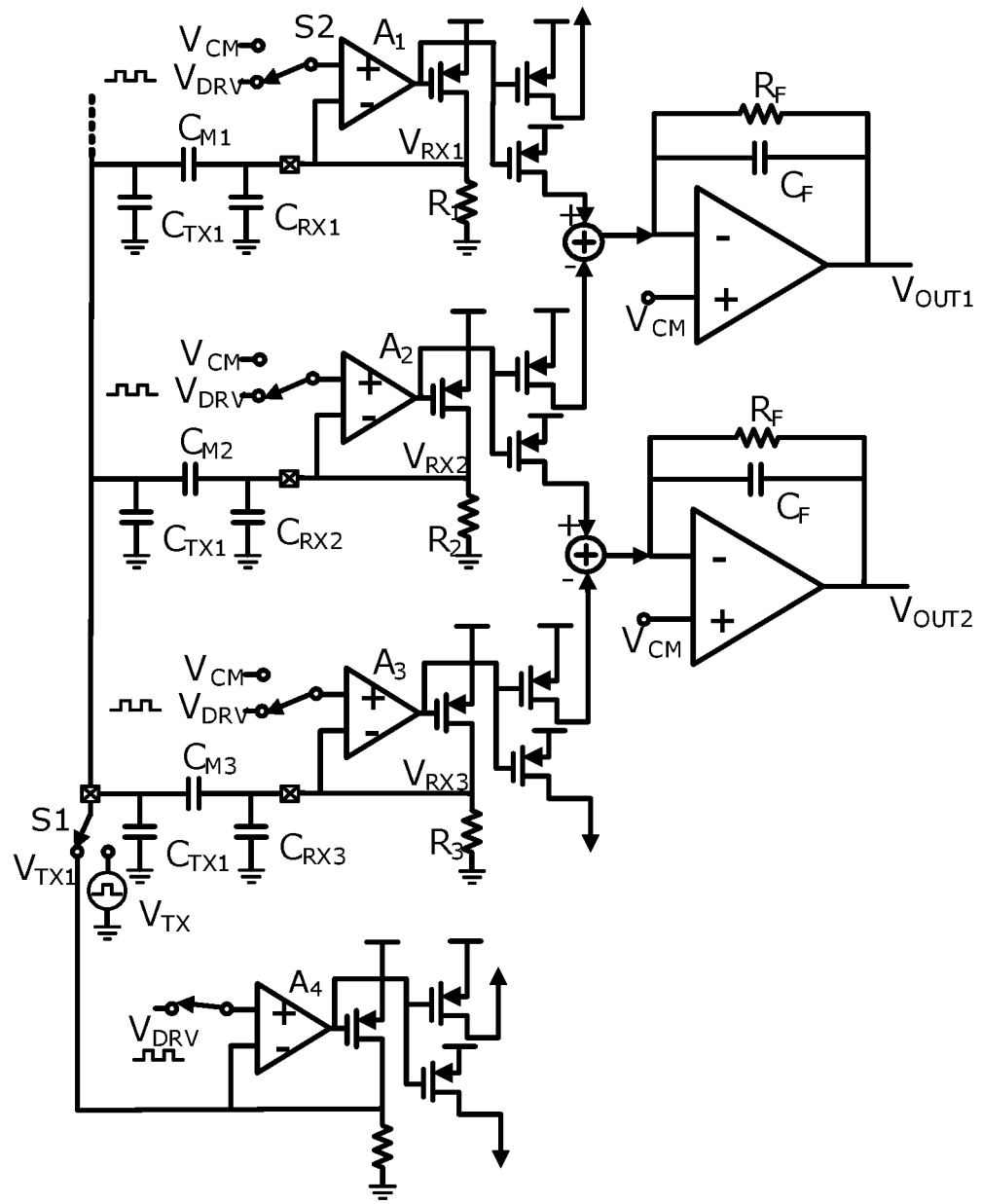
FIG. 8 is a schematic structural diagram of another working state of the capacitance detecting circuit of the embodiment shown in FIG. 7.

FIG. 8 is a schematic structural diagram of another working state of the capacitance detecting circuit of the embodiment shown in FIG. 7. As shown in FIG. 8, during a self-capacitance detection, when the first switch $S_1$ is in a second state, the first switch $S_1$ is switched to another voltage input side $V_{TX1}$. At this time, a position between the first driving capacitor $C_{TX1}$ and the first coupling capacitor $C_{M1}$ is connected with the self-capacitance coding voltage input side $V_{DRV}$, a position between the first driving capacitor $C_{TX1}$ and the second coupling capacitor $C_{M2}$ is connected with the self-capacitance coding voltage input side $V_{DRV}$, and a position between the first driving capacitor $C_{TX1}$ and the third coupling capacitor $C_{M3}$ is connected with a self-capacitance coding voltage input side $V_{DRV}$. Alternatively, when the first switch $S_1$ is in the second state, a position between the first driving capacitor $C_{TX1}$ and the first coupling capacitor $C_{M1}$ is connected with a second input side of a fourth operational amplifier $A_4$, and a first input side of the fourth operational amplifier $A_4$ is connected with the self-capacitance coding voltage input side $V_{DRV}$.

In addition, the second switch $S_2$ of the first input side of the first operational amplifier $A_1$ is also turned to the second state. At this time, the first input side of the first operational amplifier $A_1$ is connected with the self-capacitance coding voltage input side $V_{DRV}$. The second switch $S_2$ of the first input side of the second operational amplifier $A_2$ is also turned to the second state. At this time, the first input side of the second operational amplifier $A_2$ is connected with the self-capacitance coding voltage input side $V_{DRV}$. The second switch $S_2$ of the first input side of the third operational amplifier $A_3$ is also turned to the second state. At this time, the first input side of the third operational amplifier $A_3$ is connected with the self-capacitance coding voltage input side $V_{DRV}$.

Since the two input sides of the operational amplifier have the same voltage, the second input sides of the first operational amplifier $A_1$, the second operational amplifier $A_2$ and the third operational amplifier $A_3$ all select the self-capacitance coding voltage $V_{DRV}$, and the voltages $V_{RX1}$, $V_{RX2}$, $V_{RX3}$ of the first input sides of the first operational amplifier $A_1$, the second operational amplifier $A_2$ and the third operational amplifier $A_3$ will follow the self-capacitance coding voltage $V_{DRV}$. Therefore, the currents on the first induction capacitor $C_{RX1}$, the second induction capacitor $C_{RX2}$ and the third induction capacitor $C_{RX3}$ are $i_1=V_{DRV}sC_{RX1}$, $i_2=V_{DRV}sC_{RX2}$, and $i_3=V_{DRV}sC_{RX3}$, respectively. Since a TX1 electrode is switched to $V_{TX1}$ and follows a voltage change of the self-capacitance coding voltage $V_{DRV}$ like RX1, then electrode voltages at both sides of the first coupling capacitor $C_{M1}$ are the same, and the current flowing through the first induction capacitor $C_{RX1}$ will not be generated to affect a signal on the current mirror. Similarly, the electrode voltages at both sides of the second coupling capacitor $C_{M2}$ are the same, the current flowing through the second induction capacitor $C_{RX2}$ will not be generated, and the electrode voltages at both sides of the third coupling capacitor $C_{M3}$ are the same, so the current flowing through the third induction capacitor $C_{RX3}$ will not be generated.

After the current on the PMOS tube is replicated by one time or adjustable N times respectively, the currents of the two differential channels (for example, a channel where the first induction capacitor $C_{RX1}$ is located and the channel where the second induction capacitor $C_{RX2}$ is located) is subtracted by the current subtracting circuit as follows: $I_{CM1}-I_{CM2}=N(V_{DRV}sC_{RX1}-V_{DRV}sC_{RX2})$. Currents of the other two differential channels (for example, the channel where the second induction capacitor $C_{RX2}$ is located and a channel where the third induction capacitor $C_{RX3}$ is located) are subtracted by the current subtracting circuit as follows: $I_{CM2}-I_{CM3}=N(V_{DRV}sC_{RX2}-V_{DRV}sC_{RX3})$.

When there is no finger touch, $I_{CM1}-I_{CM2}=0$, $I_{CM2}-I_{CM3}=0$. However, if the finger touches the channel RX2, the second induction capacitor $C_{RX2}$ increases by $\Delta CDS$, then $I_{CM1}-I_{CM2}=-NV_{DRV}s\Delta C_S$, correspondingly, $I_{CM2}-I_{CM3}=NV_{DRV}s\Delta C_S$. The current differences $I_{CM1}-I_{CM2}$ and $I_{CM2}-I_{CM3}$ enter the charge amplifying circuit, are converted into voltage, and are amplified for ADC sampling output.

In the embodiment, by connecting the first switch at a position between the driving capacitor and the coupling capacitor, connecting the second switch at the first input side of the first operational amplifier, and by switching the switching states of the first switch and the second switch, so that when the switch is in the first state, a position between the driving capacitor and the coupling capacitor are connected with the mutual-capacitance coding voltage input side, and the first input side of the operational amplifier is connected with the fixed voltage input side to realize the circuit mutual-capacitance detection. When the switch is in the second state, a position between the driving capacitor and the coupling capacitor are connected with the self-capacitance coding voltage input side, and the first input side of the operational amplifier is also connected with the self-capacitance coding voltage input side to realize the circuit self-capacitance detection. In short, the capacitance detecting circuit provided by the embodiment changes the position of the coding voltage drive by changing the position of the switch, so as to realize mutual-capacitance and self-capacitance detection with a same circuit. In addition, since a voltage drop of the PMOS tube used in the embodiment is smaller than that of the current mirror, the capacitance detecting circuit provided in the embodiment can be driven by a lower driving voltage.

In addition, an embodiment of the present disclosure also provides a touch chip which includes the capacitance detecting circuit provided in any of the above embodiments.

An embodiment of the present disclosure also provides a touch detection apparatus which includes the capacitance detecting circuit provided in any of the above embodiments, where the touch detection apparatus determines a trigger position according to capacitance values of each capacitor determined by the capacitance detecting circuit.

Moreover, an embodiment of the present disclosure also provides an electronic device, which includes a touch detection apparatus provided in any of the above embodiments.

After considering the description and practicing the present disclosure disclosed herein, those skilled in the art will easily think of other embodiments of the present disclosure. The present disclosure aims to cover any variation, use or adaptive change of the present disclosure, which follows general principles of the present disclosure and includes common general knowledge or conventional technical means in the technical field not disclosed in the present disclosure. The description and embodiments are only regarded as exemplary, and the true scope and spirit of the present disclosure are pointed out by the following claims.

It should be understood that the present disclosure is not limited to a precise structure described above and shown in the accompanying drawings, and various modifications and changes may be made without departing from its scope. The scope of the present disclosure is limited only by the appended claims.

What is claimed is:

1. A capacitance detecting circuit, comprising: an operational amplifier, a current signal replication circuit, a current subtracting circuit, a charge amplifying circuit, an analog-to-digital conversion circuit and a processing circuit;
    a first input side of the operational amplifier is used to input a preset voltage;
    a second input side of the operational amplifier is used to configure an output voltage in a touch sensor as the preset voltage;
    an output side of the operational amplifier is connected with an input side of the current signal replication circuit;
    an output side of the current signal replication circuit is connected with an input side of the current subtracting circuit, and the current subtracting circuit is used to determine a differential signal of current signals output by two adjacent channels; and
    an output side of the current subtracting circuit is connected with the charge amplifying circuit, wherein the charge amplifying circuit is used to convert the differential signal into a voltage, amplify the voltage and input an amplified voltage to the analog-to-digital conversion circuit, so as to determine a touch position through the processing circuit after analog-to-digital conversion.

2. The capacitance detecting circuit according to claim 1, wherein during a mutual-capacitance detection, the preset voltage is a fixed voltage, and the second input side of the operational amplifier is used to configure the output voltage as the fixed voltage, so that all current signals flowing through a coupling capacitor flow into the second input side of the operational amplifier, and the coupling capacitor is a capacitor between an induction electrode and a driving electrode; or,
    during a self-capacitance detection, the preset voltage is a self-capacitance coding voltage, and the second input side of the operational amplifier is used to configure the output voltage as the self-capacitance coding voltage, so that all current signals flowing through an induction capacitor flow into the second input side of the operational amplifier.

3. The capacitance detecting circuit according to claim 2, wherein the first input side of the operational amplifier is connected with a second switch;
    when the second switch is in a first state, the first input side of the operational amplifier is connected with an input side of the fixed voltage; and
    when the second switch is in a second state, the first input side of the operational amplifier is connected with an input side of the self-capacitance coding voltage.

4. The capacitance detecting circuit according to claim 2, further comprising: a first switch;
    wherein the first switch is used to select a detection coding voltage of a driving channel;
    when the first switch is in a first state, the detection coding voltage is a mutual-capacitance coding voltage, and correspondingly, the preset voltage is the fixed voltage; and
    when the first switch is in a second state, the detection coding voltage is a self-capacitance coding voltage, and correspondingly, the preset voltage is the self-capacitance coding voltage.

5. The capacitance detecting circuit according to claim 4, wherein when the first switch is in the second state, a first input side of another operational amplifier is connected with an input side of the self-capacitance coding voltage, and a second input side of the another operational amplifier is used to output the self-capacitance coding voltage to the driving channel.

6. The capacitance detecting circuit according to claim 1, wherein the current signal replication circuit is a current mirror replication circuit or a positive channel metal oxide semiconductor (PMOS) tube replication circuit.

7. The capacitance detecting circuit according to claim 6, wherein the current mirror replication circuit comprises a first current mirror, a second current mirror and a third current mirror;
    an input side of the first current mirror is connected with a collector of a first field effect transistor, a gate of the first field effect transistor is connected with the output side of the operational amplifier, a source of the first field effect transistor is connected with one end of a first resistance, and the other end of the first resistance is grounded; and
    an output side of the first current mirror is respectively connected with an input side of the second current mirror and an input side of the third current mirror, so that output currents of the output side of the second current mirror and the output side of the third current mirror are the same as that of the input side of the first current mirror.

8. The capacitance detecting circuit according to claim 6, wherein the PMOS tube replication circuit comprises a first PMOS tube, a second PMOS tube and a third PMOS tube;
    wherein a gate of the first PMOS tube is connected with the output side of the operational amplifier, a collector of the first PMOS tube is connected with one end of the first resistance, and the other end of the first resistance is grounded; and
    a gate of the second PMOS tube and a gate of the third PMOS tube are respectively connected with the gate of the first PMOS tube, so that currents output by a collector of the second PMOS tube and a collector of the third PMOS tube are the same as that input to the gate of the first PMOS tube.

9. The capacitance detecting circuit according to claim 1, wherein the current subtracting circuit is a current subtractor circuit or an input common-mode control circuit.

10. The capacitance detecting circuit according to claim 1, wherein the charge amplifying circuit is connected with a programmable gain amplifier (PGA) circuit or an integrator circuit.

11. A touch control chip, comprising: a capacitance detecting circuit, wherein the capacitance detecting circuit comprises: an operational amplifier, a current signal replication circuit, a current subtracting circuit, a charge amplifying circuit, an analog-to-digital conversion circuit and a processing circuit;
    a first input side of the operational amplifier is used to input a preset voltage;
    a second input side of the operational amplifier is used to configure an output voltage in a touch sensor as the preset voltage;
    an output side of the operational amplifier is connected with an input side of the current signal replication circuit;
    an output side of the current signal replication circuit is connected with an input side of the current subtracting circuit, and the current subtracting circuit is used to determine a differential signal of current signals output by two adjacent channels; and
    an output side of the current subtracting circuit is connected with the charge amplifying circuit, wherein the charge amplifying circuit is used to convert the differential signal into a voltage, amplify the voltage and input an amplified voltage to the analog-to-digital conversion circuit, so as to determine a touch position through the processing circuit after analog-to-digital conversion.

12. The touch control chip according to claim 11, wherein during a mutual-capacitance detection, the preset voltage is a fixed voltage, and the second input side of the operational amplifier is used to configure the output voltage as the fixed voltage, so that all current signals flowing through a coupling capacitor flow into the second input side of the operational amplifier, and the coupling capacitor is a capacitor between an induction electrode and a driving electrode; or,
    during a self-capacitance detection, the preset voltage is a self-capacitance coding voltage, and the second input side of the operational amplifier is used to configure the output voltage as the self-capacitance coding voltage, so that all current signals flowing through an induction capacitor flow into the second input side of the operational amplifier.

13. The touch control chip according to claim 12, wherein the first input side of the operational amplifier is connected with a second switch;
    when the second switch is in a first state, the first input side of the operational amplifier is connected with an input side of the fixed voltage; and
    when the second switch is in a second state, the first input side of the operational amplifier is connected with an input side of the self-capacitance coding voltage.

14. The touch control chip according to claim 12, the capacitance detecting circuit further comprises: a first switch;
    wherein the first switch is used to select a detection coding voltage of a driving channel;
    when the first switch is in a first state, the detection coding voltage is a mutual-capacitance coding voltage, and correspondingly, the preset voltage is the fixed voltage; and
    when the first switch is in a second state, the detection coding voltage is a self-capacitance coding voltage, and correspondingly, the preset voltage is the self-capacitance coding voltage.

15. The touch control chip according to claim 14, wherein when the first switch is in the second state, a first input side of another operational amplifier is connected with an input side of the self-capacitance coding voltage, and a second input side of the another operational amplifier is used to output the self-capacitance coding voltage to the driving channel.

16. The touch control chip according to claim 11, wherein the current signal replication circuit is a current mirror replication circuit or a positive channel metal oxide semiconductor (PMOS) tube replication circuit.

17. The touch control chip according to claim 16, wherein the current mirror replication circuit comprises a first current mirror, a second current mirror and a third current mirror;
    an input side of the first current mirror is connected with a collector of a first field effect transistor, a gate of the first field effect transistor is connected with the output side of the operational amplifier, a source of the first field effect transistor is connected with one end of a first resistance, and the other end of the first resistance is grounded; and
    an output side of the first current mirror is respectively connected with an input side of the second current mirror and an input side of the third current mirror, so that output currents of the output side of the second current mirror and the output side of the third current mirror are the same as that of the input side of the first current mirror.

18. The touch control chip according to claim 16, wherein the PMOS tube replication circuit comprises a first PMOS tube, a second PMOS tube and a third PMOS tube;
    wherein a gate of the first PMOS tube is connected with the output side of the operational amplifier, a collector of the first PMOS tube is connected with one end of the first resistance, and the other end of the first resistance is grounded; and
    a gate of the second PMOS tube and a gate of the third PMOS tube are respectively connected with the gate of the first PMOS tube, so that currents output by a collector of the second PMOS tube and a collector of the third PMOS tube are the same as that input to the gate of the first PMOS tube.

19. The touch control chip according to claim 11, wherein the current subtracting circuit is a current subtractor circuit or an input common-mode control circuit; and
    the charge amplifying circuit is connected with a programmable gain amplifier (PGA) circuit or an integrator circuit.

20. A touch detection apparatus, comprising: the touch control chip according to claim 11, and the touch detection apparatus determines a trigger position according to a capacitance value of each capacitor determined by the touch control chip.

* * * * *